United States Patent [19]

Fukumoto

[11] Patent Number: 5,381,379
[45] Date of Patent: Jan. 10, 1995

[54] NON-VOLATILE DYNAMIC RANDOM ACCESS MEMORY DEVICE; A PAGE STORE DEVICE AND A PAGE RECALL DEVICE USED IN THE SAME; AND A PAGE STORE METHOD AND A PAGE RECALL METHOD

[75] Inventor: Katsumi Fukumoto, Nara, Japan

[73] Assignee: Sharp Kabushiki Kaisha, Osaka, Japan

[21] Appl. No.: 163,180

[22] Filed: Dec. 3, 1993

[30] Foreign Application Priority Data

Dec. 3, 1992 [JP] Japan .................. 4-324506
May 6, 1993 [JP] Japan .................. 5-105740

[51] Int. Cl.$^6$ .................. G11C 8/00; G11C 14/00
[52] U.S. Cl. .................. 365/238.5; 365/145; 365/195; 365/228
[58] Field of Search .................. 365/238.5, 145, 154, 365/191, 194, 195, 228, 236

[56] References Cited

U.S. PATENT DOCUMENTS

| | | | |
|---|---|---|---|
| 4,611,309 | 9/1986 | Chuang et al. | 365/185 |
| 4,809,225 | 2/1989 | Dimmler et al. | 365/145 |
| 5,146,431 | 9/1992 | Eby et al. | 365/238.5 |

FOREIGN PATENT DOCUMENTS

3-5996  1/1991  Japan .

OTHER PUBLICATIONS

Terada, Y., et al., "A new architecture for the NVRAM—an EEPROM backed-up dynamic RAM" *IEEE Journal of Solid State Circuits* (Feb. 1988) 23(1): 86-90.
Yamauchi, Y., et al., "A versatile stacked storage capacitor on flotox cell for megabit NVRAM applications" reprinted from *IEDM Tech. Dig.* (1989) pp. 595-598.
Fukumoto, K., et al., "A 256k-bit non-volatile PSRAM with page recall and chip store" *1991 Symposium on VLSI Circuits, Digest of Technical Papers* (May 1991) pp. 91-92.
Evans, J. T., et al., "An experimental 512-bit nonvolatile memory with ferroelectric storage cell" reprinted from *IEEE Journal of Solid-State Circuits* (Oct. 1988) 23(5):1171-1175.
Moazzami, R., et al., "A ferroelectric DRAM cell for high-density NVRAM's" reprinted from *IEEE Electron Device Lett.* (Oct. 1990) 11(10):454-456.
Matsukuma, S., et al., "Present and future conditions of ferroelectric memory" *Semiconductor World* (May 1990) pp. 118-125. A partial English abstract is also included herewith.
Womack, R., et al., "A 16kb ferroelectric nonvolatile memory with a bit parallel architecture" *ISSCC 89* (Feb. 1989) pp. 242-243.

*Primary Examiner*—Joseph A. Popek
*Attorney, Agent, or Firm*—Morrison & Foerster

[57] ABSTRACT

An NVDRAM memory device which performs a recall operation in which non-volatile data stored in memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, includes: a counter circuit for counting the number of the recall or store operations, which generates an inhibit signal in the case where a counted value exceeds a predetermined value and resets the counted value in response to an external reset signal; and an inhibit unit for inhibiting the recall or store operation in response to the inhibit signal given from the counter circuit.

27 Claims, 22 Drawing Sheets

FIG. 4B(1)
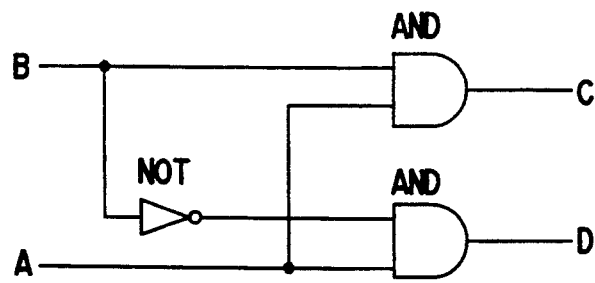
FIG. 4B(2)
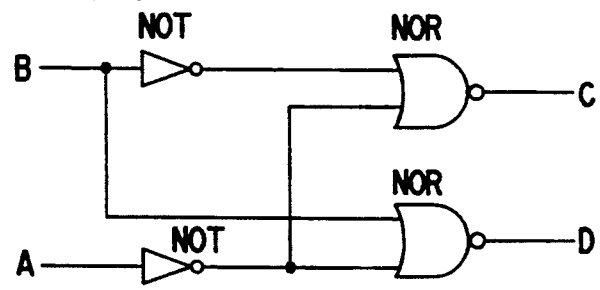
FIG. 4B(3)
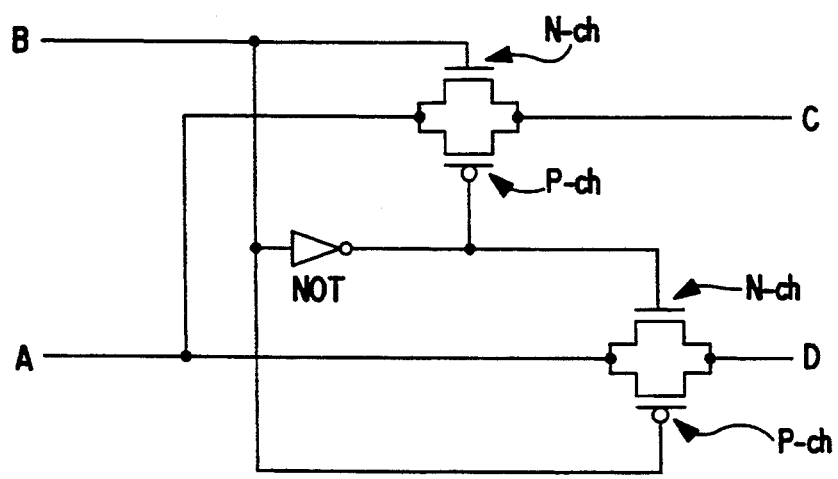
FIG. 4B(4)
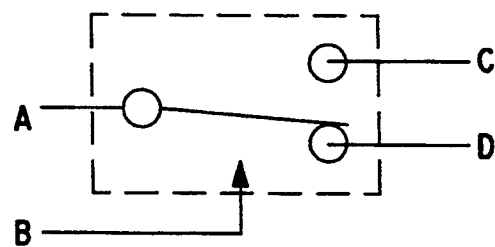

NON-VOLATILE DYNAMIC RANDOM ACCESS MEMORY DEVICE; A PAGE STORE DEVICE AND A PAGE RECALL DEVICE USED IN THE SAME; AND A PAGE STORE METHOD AND A PAGE RECALL METHOD

BACKGROUND OF THE INVENTION

1. Field of the Invention

The present invention relates to a non-volatile dynamic random access memory device; a page store device and a page recall device used in the same; a page store method using the page store device; and a page recall method using the page recall device.

2. Description of the Related Art

As for a non-volatile dynamic random access memory (NVDRAM) device, there are two kinds, i.e., a memory cell including a dynamic RAM (DRAM) cell and an electrically erasable programmable read only memory (EEPROM) cell and a memory cell having a ferroelectric.

An NVDRAM cell including a DRAM cell and an EEPROM cell has been described in the following:

(1) "A New Architecture for the NVDRAM—An EEPROM Backed-Up Dynamic RAM", IEEE Journal of Solid State Circuits, Vol. 23, No. 1, February 1988

(2) U.S. Pat. No. 4,611,309

(3) "A Versatile Stacked Storage Capacitor on a Flotox Cell for Megabit NVRAM Applications", from 1989 International Electron Devices Meeting Technical Digest, IEDM 89, pp. 595-598

(4) "A 256k-bit Non-Volatile PSRAM with Page Recall and Chip Store", 1991, Sym. VLSI circuit Dig. Tech. Papers, May, pp. 91-92

The advantage of these NVDRAMs is that while data may be quickly read from and written to the DRAM (volatile memory portion) during normal operation, it can be stored in the EEPROM (non-volatile memory portion) during power down.

An NVDRAM cell having a ferroelectric has been described in the following:

(1) "An Experimental 512-bit Nonvolatile Memory with a Ferroelectric Storage Cell" IEEE Journal of Solid State Circuits, Vol. 23, pp. 1171-1175, October, 1988.

(2) "A Ferroelectric DRAM Cell for High-Density NVRAM's", IEEE Electron Device Lett., Vol. 11, pp. 454–456, October, 1990

(3) "Present and Future Conditions of Ferroelectric Memory" Monthly, Semiconductor World, pp. 118-125 May, 1990

(4) "A 16 kb Ferroelectric Nonvolatile Memory with a Bit Parallel Architecture", ISSCC89, pp. 242-243 February, 1989, In these NVDRAM memory devices with a memory cells having a ferroelectric, a capacitor, which has a thin film made of a ferroelectric with a crystal structure of a perovskite type, such as BST ($BaSrTiO_3$), lead zirconate titanate (PZT), PLZT and $PbTiO_3$, is used in the memory cell. When an AC voltage is applied to the capacitor having a ferroelectric, the polarization state of the ferroelectric will have a hysteresis characteristic as shown in FIG. 18.

The operation in which data is written in an NVDRAM cell having a ferroelectric in a non-volatile manner will be described with reference to the hysteresis characteristic in FIG. 18.

When a positive electric field is applied to the capacitor in a point A (where the ferroelectric is not polarized), the polarization state of the retroelectric moves to a point B. When the electric field is removed under this condition, the polarization state moves to a point C, maintaining a positive residual polarization. Thereafter, when a negative electric field is applied to the capacitor, the ferroelectric is depolarized. Further application of a negative electric field inverts the polarization state of the ferroelectric and moves it to a point D. When the electric field is removed under this condition, the polarization state moves to a point E, maintaining a negative residual polarization. Accordingly, data can be stored in the NVDRAM in a non-volatile manner by inverting the polarization of the ferroelectric and maintaining a positive or negative residual polarization. In the case where a positive electric field is applied to and removed from the capacitor, the polarization state of the ferroelectric in the capacitor moves between the points B and C, and in the case where a negative electric field is applied to and removed from the capacitor, the polarization state of the ferroelectric moves between the points D and E. The polarization is not inverted between the points B and C or between the points D and E. Thus, data can be stored in the NVDRAM cell having a ferroelectric in a volatile manner in the same way as in a conventional DRAM cell.

In these NVDRAM memory devices having a memory cell with a ferroelectric, the number of elements constituting a memory cell can be decreased, compared with the combination of a DRAM cell and an EEPROM cell. Therefore, the area of the memory cell is decreased, making it possible to achieve high integration.

Here, an NVDRAM memory device with a ferroelectric cell using two transistors per cell will be described. As shown in FIG. 19, such an NVDRAM memory device includes a plurality of word lines WL and plate lines PT corresponding thereto. The word lines WL are connected to a word line decoder 1, and the plate lines PT are connected to a plate line decoder 2. The NVDRAM memory device further includes a plurality of pairs of bit lines bit and $\overline{bit}$, and the respective pair of bit lines bit and $\overline{bit}$ is connected to a sense amplifier 3. In FIG. 19, one exemplary set of sense amplifier 3 and one pair of bit lines bit and $\overline{bit}$ connected thereto is shown.

Each intersection where the word line WL and the plate line PT corresponding thereto cross the bit lines bit and $\overline{bit}$ constitutes a memory cell 4. In FIG. 19, only one exemplary memory cell 4 is shown. The memory cell 4 includes Two capacitors C1 and C2 and two selecting transistors Q1 and Q2. One terminal of the capacitor C1 and that of the capacitor C2 are connected to the bit lines bit and $\overline{bit}$ through the selecting transistors Q1 and Q2, respectively. The other one terminal of the capacitor C1 and that of the capacitor C2 are connected to the plate line PL. Respective gates of the selecting transistors Q1 and Q2 are connected to the word line WL.

In the NVDRAM memory device having the above-mentioned structure, the word line decoder 1 selects one word line WL and the plate line decoder 2 selects one plate line PT, based on an address input into an address buffer 5. The memory cell 4 is accessed in a selected mode based on a control signal input into a control signal input buffer 6. That is, in a DRAM mode where volatile data is accessed, an access operation is controlled by a DRAM mode timing control circuit 7; in a recall mode where non-volatile data is read, an access operation is controlled by a recall mode timing control circuit 8; and in a store mode where non-volatile data is written, an access operation is controlled by a store mode timing control circuit 9. Data to be accessed is transmitted from an external device to the NVDRAM memory device or transmitted from the NVDRAM memory device to the external device through an I/O interface.

The data write operation in the store mode by the store mode timing control circuit 9 will be described in detail with reference to FIGS. 20A and 20B.

In the case where data "0" is written, as shown in FIG. 20A, a voltage signal of 0 V is applied to the bit line bit and a voltage signal of 5 V is applied to the bit line $\overline{\text{bit}}$, whereby the word line WL is activated. Under this condition, a pulse voltage signal changing from 0 V to 5 V to 0 V is applied to the plate line PT. A ferroelectric of the capacitor C1 has its polarization state changed from the point C or the point E to the point B and then to the point C; and a ferroelectric of the capacitor C2 has its polarization state changed from the point D to the point E and then to the point D (see FIG. 18). Thus, even though an electric field is removed from the capacitors C1 and C2 thereafter, the ferroelectrics of the capacitors C1 anti C2 maintain the residual polarizations thereof at the points C and E, respectively. In this way, data "0" is stored in a non-volatile manner. In the case where data "1" is written, as shown in FIG. 20B, a voltage of 5 V is applied to the bit line bit and a voltage of 0 V is applied to the bit line $\overline{\text{bit}}$, whereby the word line WL is activated. Under this condition, a pulse voltage signal changing from 0 V to 5 V to 0 V is applied to the plate line PT. The ferroelectrics of the capacitors C1 and C2 maintain the residual polarizations thereof at the points E and C, respectively. In this way, data "1" is stored in a non-volatile manner.

Next, the data read operation in the recall mode by the recall mode timing control circuit 8 will be described in detail with reference to FIG. 20C.

The bit lines bit and $\overline{\text{bit}}$ are precharged to 0 V and made to be in a floating state. Then the word line WL is activated. Under this condition, a pulse voltage signal changing from 0 V to 5 V is applied to the plate line PT. In the case where data "0" is stored, the polarization state of the ferroelectric of the capacitor C1 is changed from the point C to the point B; and the polarization state of the ferroelectric of the capacitor C2 is changed from the point E to the point B (see FIG. 18). In this case, the ferroelectric of the capacitor C2 has its polarization state inverted. Therefore, the electric potential of the bit line $\overline{\text{bit}}$ connected to the capacitor C2 becomes about hundreds of milli-volts higher than that of the bit line bit. The sense amplifier 3 detects the difference in electric potential between the bit lines bit and $\overline{\text{bit}}$ and the non-volatile data can be read out. In this case, the polarization states of the ferroelectrics of the capacitors C1 and C2 move to the point B, so that data has been stored in a non-volatile manner is lost (i.e., destructive read is performed).

The difference in electric potential between the bit lines bit and $\overline{\text{bit}}$ in the recall mode is directly proportional to the residual polarization and is inversely proportional to the bit line capacitance. Thus, as the residual polarization is larger and the bit line capacitance is smaller, the difference in electric potential is larger, so that difference in electric potential can be easily detected by the sense amplifier 3.

The access operation in the DRAM mode controlled by the DRAM mode timing control circuit 7 is performed under the condition that the plate line PT is applied with a voltage of 0 V, in the same way as in a conventional DRAM memory device. The polarization state of the ferroelectrics of the capacitors C1 and C2 move only between the points D and E (see FIG. 18). In the same way as in a conventional DRAM memory device, data can be stored in a volatile manner and read out from the memory cell by means of an electric charge stored in the capacitors C1 and C2.

The NVDRAM memory device having a memory cell with a ferroelectric can also be operated only in the store mode and in the recall mode. However, the ferroelectrics in the capacitors C1 and C2 of the memory cell 4 have a limited possible number of polarization inversions so that the recall/store operation is limited to about $10^9$ to $10^{12}$ times. If an access operation is successively performed in a cycle of about 100 ns, the memory cell 4 is worn out in a few days.

In order to prevent the above-mentioned disadvantage, in the NVDRAM memory device having a memory cell with a ferroelectric, the data is accessed during normal read/write operations in the DRAM mode, where the polarization of the ferroelectric is not inverted. Only in the case where data should be stored in a non-volatile manner (i.e., at a time when a power source is turned ON or OFF), data is accessed in the recall mode and in the store mode. In this way, the number of data access involving the polarization inversion is made as small as possible. A cell area of the NVDRAM cell including two Transistors and two capacitors is large, which makes it difficult to highly integrate cells. In view of this, an NVDRAM cell including one transistor and one capacitor, using a dummy cell, has been suggested.

The conventional NVDRAM memory devices have the following problems:

In the conventional NVDRAM memory cell, a recall operation or a store operation is performed in accordance with an address input into an external address pad or an address generated by an internal address counter circuit. According to this method, if access operations in the recall mode or the store mode are repeatedly ordered due to the bugs in a program or the runaway of a computer device controlling these operations, the polarization is also repeatedly inverted. As a result, the number of data access will reached the limited access number and make the life of the memory cell 4 much shorter than that expected.

Data access operation in the recall mode in the conventional NVDRAM cell is a destructive read of data, as described above. Therefore, if data which is once read out is somehow lost, this data cannot be restored any more.

When an electric charge as volatile data is stored in the capacitor during the data access operation in the recall mode, this electric charge causes a noise to disturb the read out of non-volatile data.

When a memory cell has a one transistor per cell structure as in the conventional NVDRAM memory device, a dummy cell provided for the normal memory cell with one capacitor cannot be formed in the same configuration as that of the normal memory cell. This causes the production of a semiconductor memory device to be complicated.

In the conventional NVDRAM memory devices, in some cases, recorded data is broken, if the store operation is performed immediately after a power source is turned ON.

In the conventional NVDRAM memory device, data is stored as a variable electric charge in a capacitor of each memory cell, since the memory cells have no built-in restore capability. Each memory cell has no active pull-up or pull-down circuit elements for altering the electric charge in the capacitor of each memory cell independently. Therefore, a sense amplifier as an external circuit should be used to provide an electric charge corresponding to a full swing logic 0 or logic 1 onto the capacitor of the memory cell.

Lacking an externally initiated restore operation following data recall from an EEPROM cell portion with polarization inversion to a DRAM cell portion without polarization in the conventional NVDRAM cell, the memory cell will contain degraded voltage levels of logic state 0 or 1. When the data in the DRAM cells are subsequently read out in a conventional DRAM manner, these degraded voltage levels in memory cells may result in the detection of incorrect data. Therefore, it is necessary to perform a conventional DRAM restore operation during the recall/store operation to ensure the voltage level of full logic state 0 or 1 in the DRAM cell. This restore operation can only reliably perform to one memory cell per bit line at any one time.

Thus, in the NVDRAM memory device having a memory cell with a ferroelectric, recall/store operation for all memory cells is not feasible simultaneously; only one memory cell per bit line should be recalled or stored at any one time.

For the above reason, in an apparatus having a plurality of NVDRAM memory devices, for example, the number of the store operations performed to store data in all memory cells is represented by (Number of NVDRAM memory devices)×(Number of word lines). Assuming all memory cells connected to one word line is defined as one page, the number of the store operation is represented by (Number of NVDRAM memory devices)×(Number of pages). When the NVDRAM memory devices are increased in number, the store operation is repeated in accordance with the number of the NVDRAM memory devices, resulting in the -waste of time. In the case where the store operation is repeated for more than the above-mentioned times due to the bugs in a program or the runaway of an external control circuit, the polarization inversion of the ferroelectric is repeated in a wasteful manner.

A page recall device and a page recall method using the same as shown in FIG. 21 is described by Eby et al., in U.S. Pat. No. 5,146,431 (the inventor of the present invention is a coinventor of this patent). The recall operation has the same problems as those of the store operation described above. In the recall device shown in FIG. 21, in the case where the recall operation is repeated for more than required number due to the runaway of the external control circuit, etc. the polarization inversion of the ferroelectric is repeated in a wasteful manner.

SUMMARY OF THE INVENTION

The NVDRAM memory device of the present invention, which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, includes:

a counter circuit for counting the number of the recall or store operations, which Generates an inhibit signal in the case where a counted value exceeds a predetermined value and resets the counted value in response to an external reset signal: and an inhibit unit for inhibiting the recall or store operation in response to the inhibit signal given from the counter circuit.

In one embodiment of the present invention, the memory cell has a capacitor with a ferroelectric, the non-volatile data is held due to a polarization of the ferroelectric, and the volatile data is held due to an electric charge stored in the capacitor.

In another embodiment of the present invention, the recall operation is performed by detecting a change of an electric potential caused at a storage node of the capacitor in accordance with a state of the polarization, in the case where a voltage signal is applied to a plate electrode of the capacitor.

In still another embodiment of the present invention, the store operation is performed by applying a voltage signal, which corresponds to data, to the storage node of the capacitor and applying a pulse voltage signal to the plate electrode of the capacitor, thereby putting the ferroelectric in a polarized state corresponding to the data.

In still another embodiment of the present invention, the memory cell has a DRAM cell portion and an EEPROM cell portion, the non-volatile data is held in the EEPROM cell portion of the memory cell, and the volatile data is held in the DRAM cell portion of the memory cell.

In still another embodiment of the present invention, the above-mentioned NVDRAM memory device includes: a restore unit for restoring the non-volatile data recalled from the memory cell in the identical memory cell during The recall operation; and a canceling unit for canceling the inhibit of the store operation when the recall operation starts or ends.

In still another embodiment of the present invention, the above-mentioned NVDRAM memory device includes an initial store inhibit unit for inhibiting the store operation when a power source is turned ON in the NVDRAM memory device.

In still another embodiment of the present invention, the counter circuit has a recall operation counter and a store operation counter, and the initial store inhibit unit has a first switching unit and a second switching unit.

In still another embodiment of the present invention, the above-mentioned NVDRAM memory device includes:

a recall mode control unit for controlling the recall operation;

a store mode control unit for controlling the store operation;

a DRAM mode control unit for controlling the read/write/refresh operation; and a signal input unit for generating a recall mode selection signal, a store mode selection signal, and a DRAM mode selection signal, giving the recall mode selection signal to the recall operation counter, the store operation counter, and the first switching unit, giving the store mode selection signal to the store operation counter and the second switching unit, and giving the DRAM mode selection signal to the recall operation counter and the DRAM mode control unit, wherein the recall operation counter counts the input number of the recall mode selection signals to generate a recall inhibit signal in the case where a counted value exceeds a predetermined value and to reset the counted value upon receiving the DRAM mode selection signal;

the store operation counter counts the input number of the store mode selection signals to generate a store inhibit signal in the case where a counted value exceeds a predetermined value and resets the counted value upon receiving the recall mode selection signal;

the first switching unit switches an output of the recall mode selection signal from a first output to a second output in response to the recall inhibit signal, the first output being connected to the recall mode control unit, end the second output being connected to the DRAM mode control unit; and the second switching unit blocks the store mode selection signal in response to the store inhibit signal.

According to another aspect of the present invention, a page recall method in an NVDRAM memory device which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, the method includes the steps of:

counting the number of the recall operations;

generating a recall operation inhibit signal in the case where a counted value of the recall operations exceeds a predetermined value;

inhibiting the recall operation in response to the recall operation inhibit signal; and resetting the counted value of the recall operations in response to a reset signal.

According to still another aspect of the present invention, a page store method in an NVDRAM memory device which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, the method includes the steps of:

counting the number of the store operations;

generating a store operation inhibit signal in the case where a counted value of the store operations exceeds a predetermined value;

inhibiting the store operation in response to the store operation inhibit signal; and resetting the counted value of the store operations in response to a reset signal.

In one embodiment of the present invention, the above-mentioned page store method includes the steps of: restoring the non-volatile data, which is recalled from the memory cell during the recall operation, in the identical memory cell; and canceling the inhibit of the store operation when the recall operation starts or ends.

In another embodiment of the present invention, the above-mentioned page store method further includes an initial store inhibit step of inhibiting the store operation right after a power source is turned ON in the NVDRAM memory device.

According to still another aspect of the present invention, a page store device provided in an NVDRAM memory device having address lines, includes:

a plurality of address selector circuits, each having a first input to which a page store start address signal for addressing an externally designated address or an internally generated address is input, a first output via which a second start address signal corresponding to the page store start address signal is output, a second input, and a second output;

a counter circuit having a plurality of counter inputs respectively connected to the first outputs of the plurality of address selector circuits and a plurality of counter outputs respectively connected to the second inputs of the plurality of address selector circuits through the respective address lines, the counter circuit generating a counter output signal corresponding to the second start address signal input to the counter inputs and outputting the counter output signal from the counter outputs to the second inputs of the address selector circuit through the address line; and an address decoding circuit which is connected to the second output of each of the address selector circuits and which receives an output signal from the second output to address a page to be stored.

In one embodiment of the present invention, each of the address selector circuits includes:

an output gate outputting the second start address signal via the first output based on a first enable signal and the page store start address signal;

a first transmission gate outputting the second start address signal via the second output based on the second enable signal; and a second transmission gate outputting the counter output signal, which is given to the second input, via the second output based on a third enable signal.

In another embodiment of the present invention, the counter circuit includes a unit for increasing a value of the counter output signal.

In still another embodiment of the present invention, the address decoding circuit addresses consecutive pages to be stored based on an increased value of the counter output signal.

In still another embodiment of the present invention, the above-mentioned page store device includes: a store operation inhibit signal generating circuit generating a store operation inhibit signal based on a count signal given from the counter circuit; and a store operation inhibit unit for inhibiting a page store operation based on the store operation inhibit signal.

According to still another aspect of the present invention, a page store method in an NVDRAM memory device provided with a memory cell array, in which the memory cell array has a plurality of bit lines, a plurality of word lines, a plurality of plate lines, and a plurality of memory cells; each of the memory cells is connected to one bit line, one word line, and one plate line; each of the bit lines is connected to one of a plurality of first subsets of the memory cell and the first subset does not overlap with another first subset to which another bit line is connected; each of the word lines and each of the plate lines corresponding thereto are connected to one of a plurality of second subsets of the memory cells; and the second subset does not overlap with another second subset to which another word line and another plate line corresponding Thereto are connected, the method includes;

a first step of activating one of the word lines and addressing each memory cell of the second subset to which the activated word line is connected, thereby activating the second subset;

a second step of activating all of the bit lines and accessing each memory cell, among any of the first subsets of the memory cells, which also belongs to the second subset activated in the first step; and a third step of activating the plate line corresponding to the word line activated in the first step, thereby storing data of each memory cell accessed in the second step.

In one embodiment of the present invention, the first step, the second step, and the third step are inhibited in the case where a predetermined condition is provided.

In another embodiment of the present invention, the above-mentioned page store method includes the steps of;

counting the number of the addressings in the first step;

generating a store inhibit signal in the case where a counted value exceeds a predetermined value; and inhibiting the first step, the second step, and the third step based on the store inhibit signal.

According to still another aspect of the present invention, a page recall device provided in an NVDRAM memory device having address lines, includes:

a plurality of address selector circuits, each having a first input to which a page recall start address signal for addressing an externally designated address or an internally generated address is input, a first output via which a second start address signal corresponding to the page recall start address signal is output, a second input, and a second output;

a counter circuit having a plurality of counter inputs respectively connected to the first outputs of the plurality of address selector circuits and a plurality of counter outputs respectively connected to the second inputs of the plurality of address selector circuits through the respective address lines, the counter circuit generating a counter output signal corresponding to the second start address signal input to the counter inputs and outputting the counter output signal from the counter outputs to the second inputs of the address selector circuit through the address line;

an address decoding circuit which is connected to the second output of each of the address selector circuits and which receives an output signal from the second output to address a page to be recalled;

a unit for arbitrarily setting an initial count value of the counter circuit;

a recall operation inhibit signal generating circuit generating a recall operation inhibit signal based on a count signal given from the counter circuit; and a recall operation inhibit unit for inhibiting a page recall operation based on the recall operation inhibit signal.

In one embodiment of the present invention, each of the address selector circuits includes:

an output gate outputting the second start address signal via the first output based on a first enable signal and the page; recall start address signal;

a first transmission gate outputting the second start address signal via the second output based on the second enable: signal; and a second transmission gate outputting the counter output signal, which is given to the second input, via the second output based on a third enable signal.

In another embodiment of the present invention, the counter circuit includes a unit for increasing a value of the counter output signal.

In still another embodiment of the present invention, the address decoding circuit addresses consecutive pages to be recalled based on an increased value of the counter output signal.

According to still another aspect of the present invention, a page recall method in an NVDRAM memory device provided with a memory cell array, in which the memory cell array has a plurality of bit lines, a plurality of word lines, a plurality of plate lines, and a plurality of memory cells; each of the memory cells is connected to one bit line, one word line, and one plate line; each of the bit lines is connected to one of a plurality of first subsets of the memory cell and the first subset does not overlap with another first subset to which another bit line is connected; each of the word lines and each of the plate lines corresponding thereto are connected to one of a plurality of second subsets of the memory cells; and the second subset does not overlap with another second subset to which another word line and another plate line corresponding thereto are connected, the method includes;

a first step of activating one of the word lines and addressing each memory cell of the second subset to which the activated word line is connected, thereby activating the second subset;

a second step of activating all of the bit lines and accessing each memory cell, among any of the first subsets of the memory cells, which also belongs to the second subset activated in the first step; and a third steep of activating the plate line corresponding to the word line activated in the first step, thereby recalling data of each memory cell accessed in the second step; and a fourth step of inhibiting the first step, the second step, and the third step in the case where a predetermined condition is provided.

In one embodiment of the present invention, the above-mentioned page recall method includes the steps of;

counting The number of the addressings in the first step; and generating a recall inhibit signal in the case where a counted value exceeds a predetermined value, wherein the fourth step is executed based on the recall inhibit signal.

Thus, the invention described herein makes possible the advantages of (1) providing an NVDRAM in which the life time of a memory cell is not shortened faster than expected due to any bugs in a program or the runaway of an external control circuit, etc. by preventing a recall operation and a store operation from being repeated for more than a predetermined number of times; (2) providing an easily operable page store device and a page store method using the same, in which the waste of time for the store operation and the number of polarization inversions of a ferroelectric can be decreased; and (3) providing an easily operable page recall device and a page recall method using the same in which the waste of time for the recall operation and the number of polarization inversions of a ferroelectric can be decreased.

These and other advantages of the present invention will become apparent to those skilled in the art upon reading and understanding the following detailed description with reference to the accompanying figures.

BRIEF DESCRIPTION OF THE DRAWINGS

FIG. 4B shows examples of a circuit diagram of a switching circuit according to the present invention.

DESCRIPTION OF THE PREFERRED EMBODIMENTS

Figure 1:
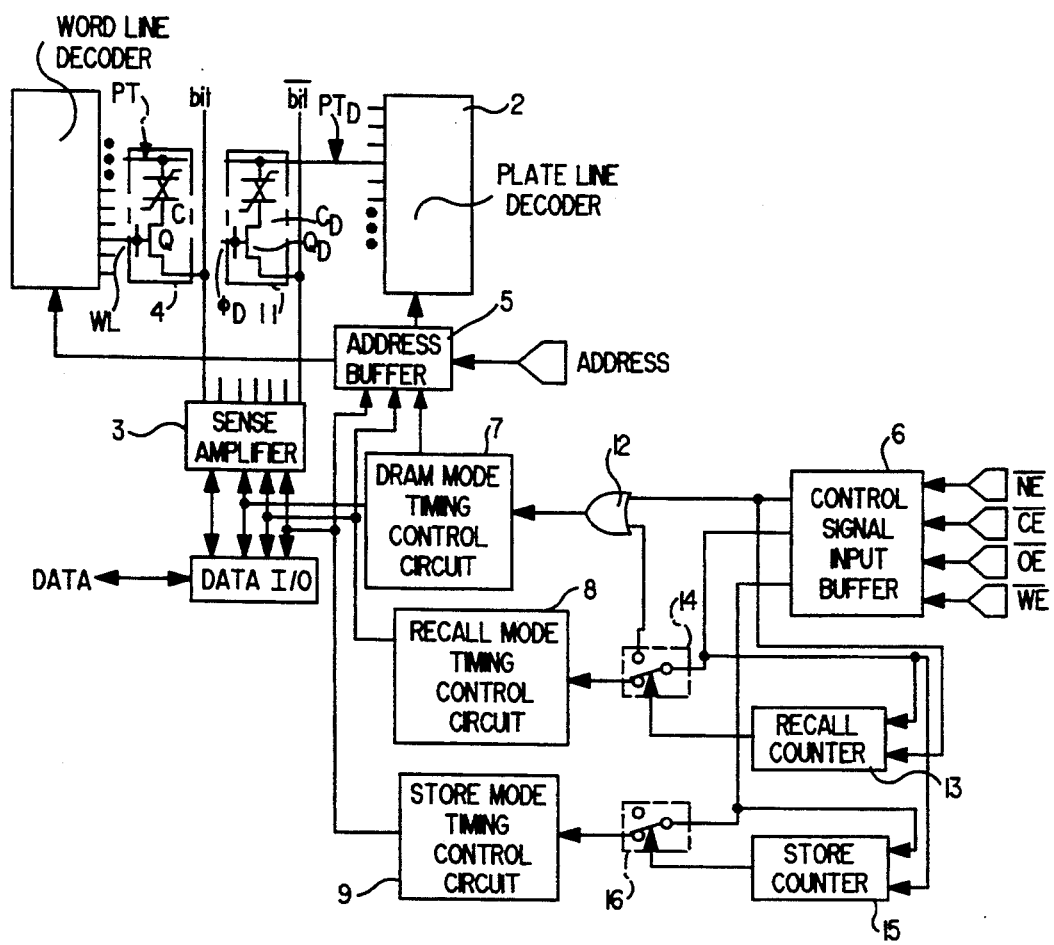
FIG. 1 is a block diagram showing the structure of a control portion of an NVDRAM memory device according to the present invention.

Hereinafter, the present invention will be described by way of illustrative examples with reference to the drawings.

EXAMPLE 1

Recall and store methods in an NVDRAM memory device according to the present invention will be described.

When a recall command is input to an NVDRAM memory device, a recall operation starts and data is read out, while a recall counter counts the number of recall operations, the recall operation is a destructive read of data, so that the recall operation causes the polarization inversion of a ferroelectric in the memory cell. When the number of recall operations exceeds a predetermined number, a recall-inhibit circuit inhibits the recall operation. The reason for inhibiting the recall operation is as follows:

After the recall operation is performed, (i.e., after data is transferred from a non-volatile memory to a volatile memory ), the data in the non-volatile memory is identical to that in the volatile memory. Therefore, the data can be held or read by a refresh operation or a read operation in a DRAM mode, instead of the recall operation causing the polarization inversion of the ferroelectric.

Even though a recall mode signal is output from a control signal input buffer at a time when the recall operation is inhibited, a DRAM mode timing control circuit is selected to perform the refresh operation or the read operation, which does not cause the polarization inversion of the ferroelectric. Thus, the data can be held and read.

According to this recall method, even should the recall command be repeatedly input to the NVDRAM memory device due to the bugs in a program or the runaway of a computer device controlling the NVDRAM memory device, the recall operation is inhibited after a predetermined number of recall operations have been performed in the NVDRAM memory device. Therefore, the recall operation can be prevented from being repeated more than necessary due to the recall command being repeated abnormally. However, if the recall command is input to the NVDRAM memory, device after data is accessed in the DRAM mode or in the store mode, for example, such a recall command is considered to be a normal one even though it is input after a predetermined number of recall operations. In the case where the recall operation is commanded more than a predetermined number set in the recall counter, if the recall command input after the predetermined number is a normal one (as in the case of the recall command after the data access in the DRAM mode or in the store mode), the count value of the recall counter is reset. Thus, the recall operation is not inhibited, in the case where a normal recall command is repeatedly input more than a predetermined number in a normal manner.

In the case where the recall counter is provided for each group of memory cells from which data is recalled at the same time, when the count value of the recall counter reaches two or more, this means that the recall command is input repeatedly with respect to the identical memory cell. Thereafter, the recall operation can be inhabited at any time.

There is another case where the recall operation is performed for each page which is a subset of a plurality of memory cells and one recall counter is provided for a plurality of pages. In this case, the recall command is input successively with respect to the plurality of pages. Therefore, the recall operation should be inhibited after counting up the number of recall operations for at least all of the pages.

In the case where the recall-inhibit circuit inhibits the recall operation, the read and refresh operations can be performed in the DRAM mode. The read and refresh operations in the DRAM mode do not cause the polarization inversion of the ferroelectric, so that the life time of a memory cell is not shortened due to these operations. Even when the recall-inhibit circuit inhibits the recall operation, if data is accessed in the DRAM mode, the count value of the recall counter is reset, so that the recall inhibit can be automatically canceled. Alternatively, the recall inhibit can be canceled by a external signal.

As described above, according to the present invention, even though the recall command is repeatedly input to the NVDRAM memory device due to the bugs in a program or the runaway of the computer device, etc., the recall operation is inhibited after a predetermined number of the recall operations. Thus, there is no possibility that the polarization inversion of the ferroelectric is repeated more than necessary due to such a abnormal repetition of the recall command, shortening the life Time of a memory cell.

When a store command is input to the NVDRAM memory device according to the present invention, a store operation starts and data starts being stored, while a store counter counts the number of store operations. The store operation is a non-volatile storage of data, so that the polarization inversion of the ferroelectric is caused. When the count value exceeds a predetermined number, a store-inhibit circuit inhibits the store operation.

Thus, in the same way as in the above-mentioned recall method, in the case where the store command is repeatedly input to the NVDRAM memory device due to the bugs in a program or the runaway of the computer device, etc., the store operation command, after a predetermined number, is inhibited in the NVDRAM memory device. Therefore, the store operation can be prevented from being repeated more than necessary due to the abnormal repetition of the store command. However, if the store command is input to the NVDRAM memory device after the recall operation or write operation is performed, such a store command is considered to be a normal one even though the store command is input to the NVDRAM memory device after the store operation is performed. In the case where the store operation command is repeated more than a predetermined number set in the store counter, if the store command input after the predetermined number is a normal one (as in the case where the recall command is input after the store command is input, and then the store command is input again), the count value of the store counter is reset. Thus, the store operation is not inhibited, in the case where a normal store is input more than a predetermined number.

In the case where the store counter is provided for each group of memory cells in which data is stored at the same time, when the count value of the store counter reaches two or more, this means that the store command is input repeatedly with respect to the identical memory cell. Thereafter, the store operation can be inhibited at any time.

There is another case where the store operation is performed for each page which is a subset of a plurality of memory cells and one store counter is provided for a plurality of pages. In this case, the store command is input successively with respect to the plurality of pages. Therefore, the store operation should be inhibited after counting up the number of store operations for at least all of the pages.

In the case where the store-inhibit circuit inhibits the store operation, if data is recalled or accessed in the DRAM mode, the count value of the store counter is reset, so that the store inhibit can be automatically canceled. Alternatively, the store inhibit can be canceled by a external signal.

As described above, according to the present invention, even though the store command is repeatedly input to the NVDRAM memory device due to the bugs in a program or the runaway of a computer device, etc., the store operation is inhibited after a predetermined number of the store operations. Thus, there is no possibility that the polarization inversion of the ferroelectric is repeated more than necessary due to such an abnormal repetition of the store command, shortening the life time of a memory cell.

The recall operation is a destructive read of data, as described above. However, when data is read by the recall operation, the data is automatically restored in the same memory cell in a non-volatile manner by a restore operation, in a recall mode. Since the data read by the recall operation can be restored in the same memory cell in a non-volatile manner, the safety of the data is increased. The restored data can be read by performing the recall operation.

If an electrs:tic charge is stored in a capacitor of a memory cell which is to be recalled, the electric charge has an effect (i.e., a noise) on the electric potential difference caused by polarization inversion at one terminal of the capacitor. Thus, incorrect data may be read out from the memory cell. In order to prevent this problem, the following is conducted: Before a voltage signal is applied to the other terminal of the capacitor for the recall operation, the capacitor is discharged by a discharge operation during the recall operation. In this way, non-volatile data can be read without error.

In the NVDRAM memory device with memory cells of a so-called one transistor per cell structure, one dummy cell is connected to two bit lines through selecting transistors. These two bit lines are respectively connected to two memory cells on a single word line. If the capacitance of these two bit lines are the same, the electric charge of the dummy cell is equally distributed to these two bit lines. Therefore, these bit lines are provided with an electric potential which is half (for example) of that in the case where the electric charge of a memory cell is applied to one bit line. Thus, the dummy cell can be formed in the same configuration as that ,Dr the normal memory cell in the NVDRAM memory device having the memory cell with a ferroelectric in a one transistor per cell structure. Because of this, it is not required to make the size of the dummy cell half of that of the normal memory cell for the purpose of limiting the capacity of the dummy cell, making it easy to produce the NVDRAM memory device.

In general, when a power source is turned ON, stored data is read out. The count value of the store counter is set at a time when the power source is turned ON so that the store operation is inhibited. Thus, the stored data is safely guarded.

Hereinafter, the NVDRAM memory device of the present invention will be described with reference to the drawings.

Figure 2:
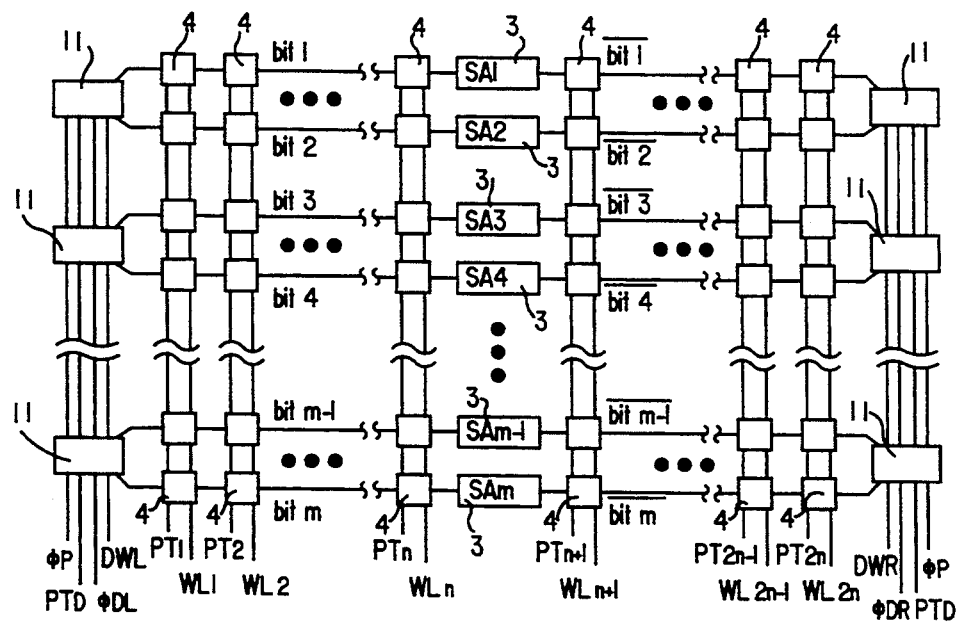
FIG. 2 is a block diagram showing the structure of a memory cell array of the NVDRAM memory device according to the present invention.
Figure 3A:
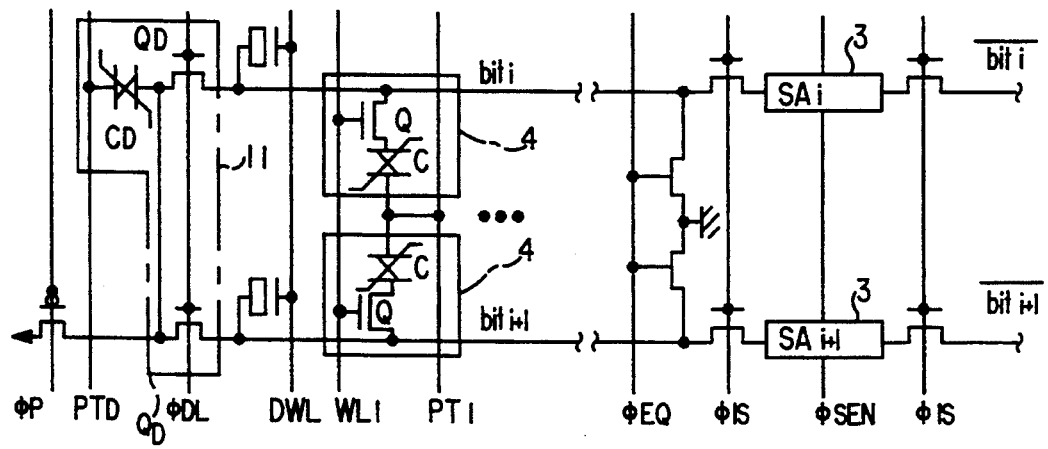
FIG. 3A is a circuit diagram showing the structure of a bit line bit shown in FIG. 2.
Figure 3B:
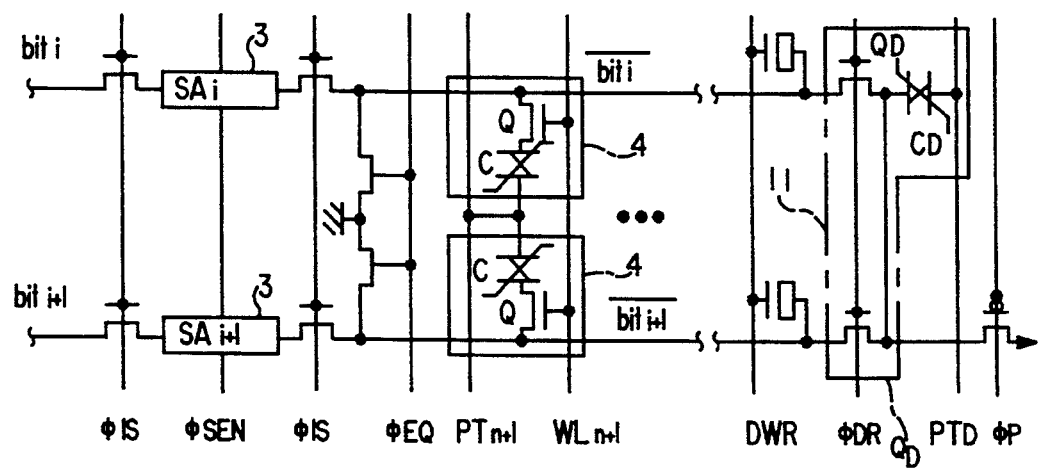
FIG. 3B is a circuit diagram showing the structure of a bit line $\overline{bit}$ shown in FIG. 2.
Figure 5:
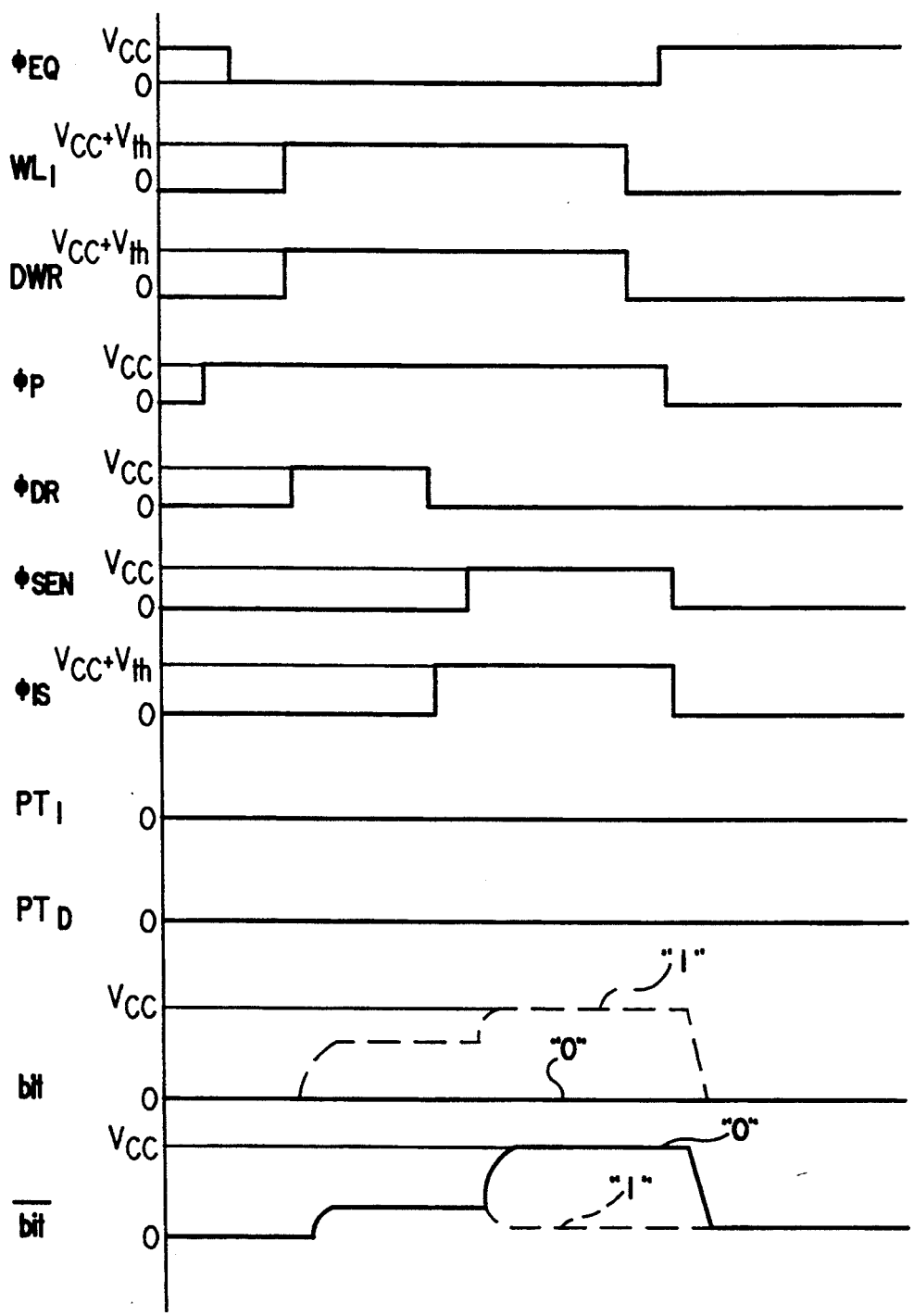
FIG. 5 is a timing chart showing the operation in a DRAM mode in the NVDRAM memory device according to the present invention.
Figure 6:
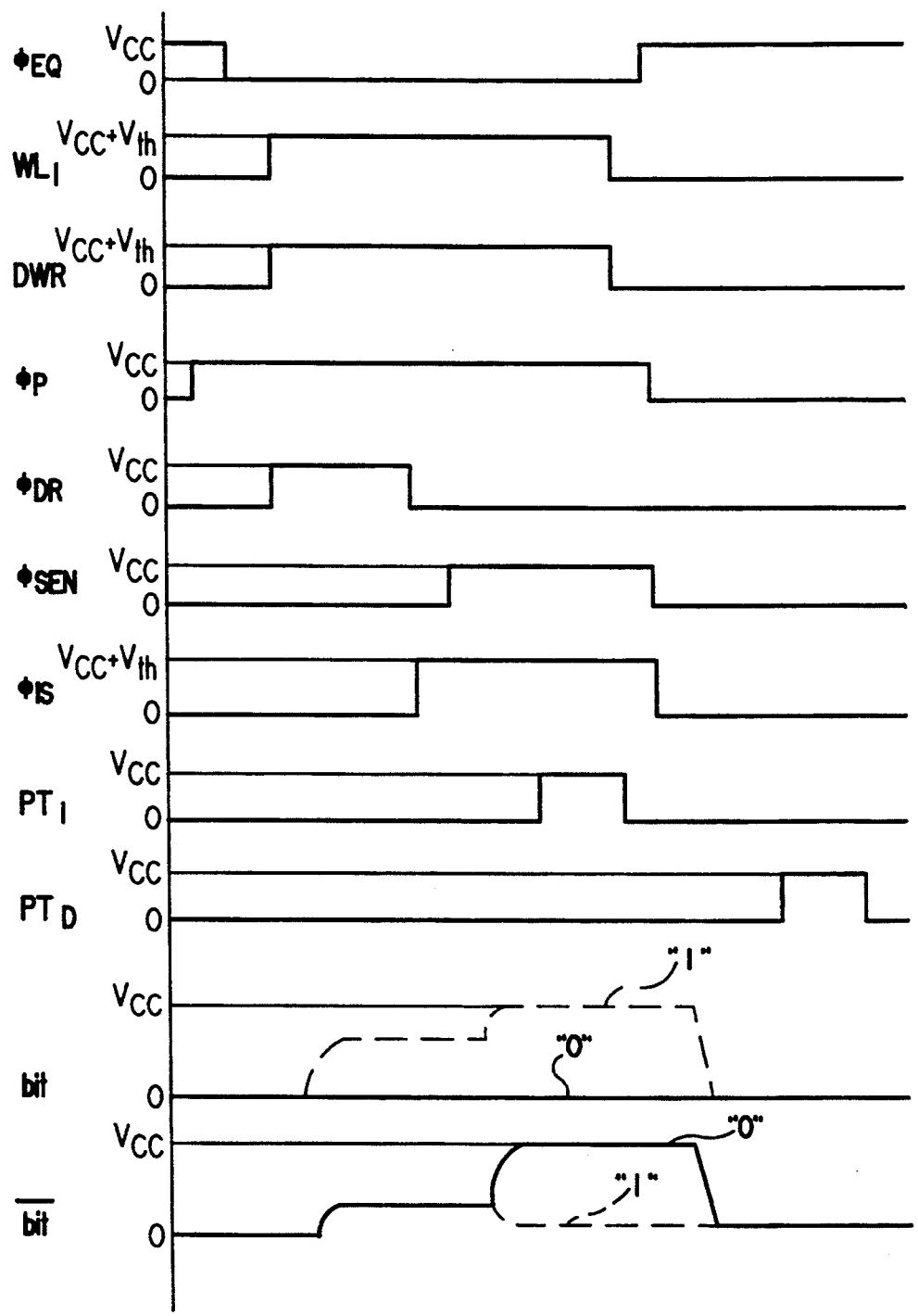
FIG. 6 is a timing chart showing the operation in a store mode in the NVDRAM memory device according to the present invention.
Figure 7:
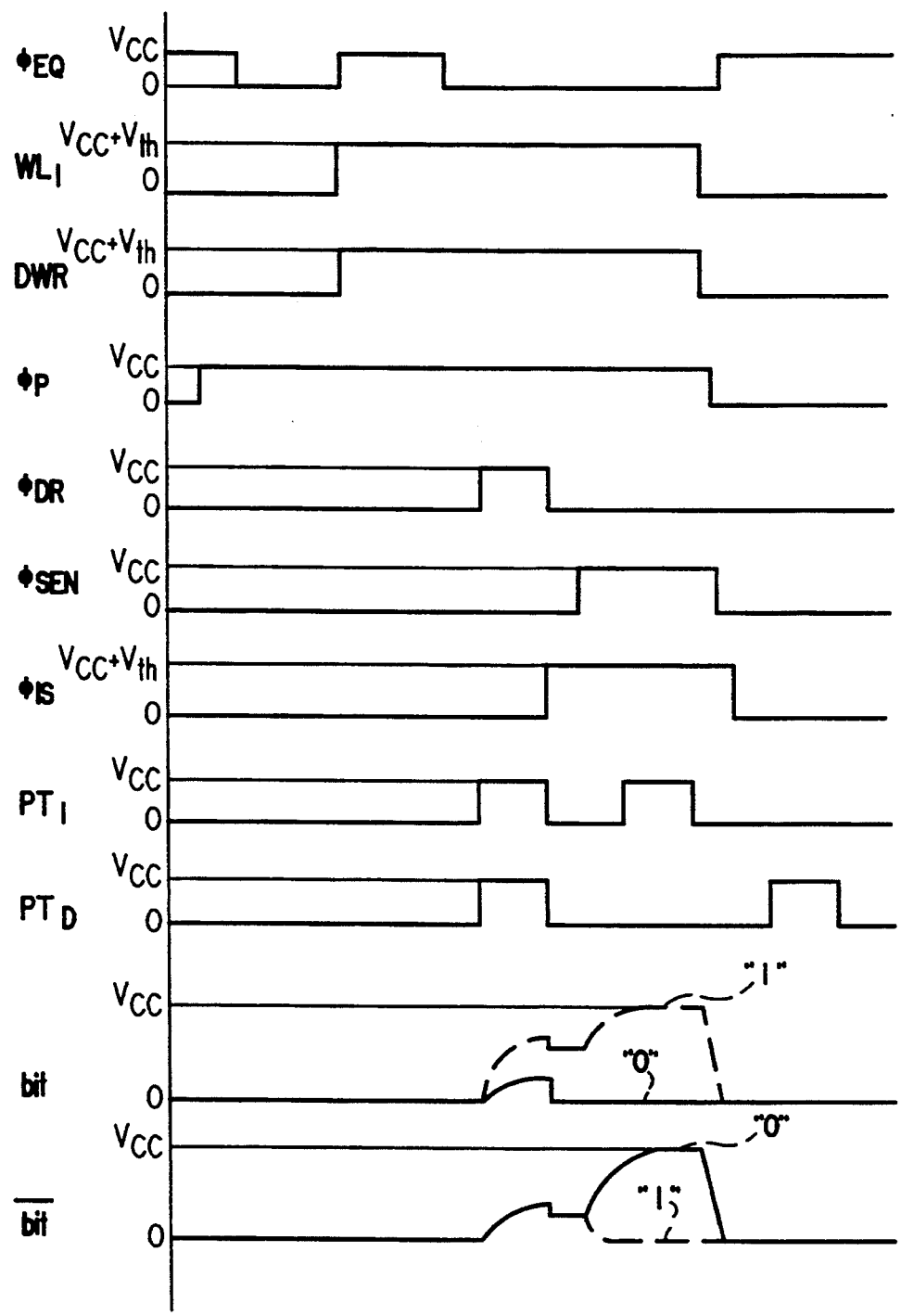
FIG. 7 is a timing chart showing the operation in a recall mode in the NVDRAM memory device according to the present invention.

FIG. 1 is a block diagram showing the structure of a control portion of the NVDRAM memory device. FIG. 2 is a block diagram showing the structure of a memory cell array of the NVDRAM memory device. FIG. 3A is a circuit diagram showing the structure of the memory cell array in a bit line bit side shown in FIG. 2. FIG. 3B is a circuit diagram showing the structure of the memory cell array in a bit line $\overline{bit}$ side shown in FIG. 2. FIG. 5 is a timing chart showing the operation in a DRAM mode in the NVDRAM memory device. FIG. 6 is a timing chart showing the operation in a store mode in the NVDRAM memory device. FIG. 7 is a timing chart showing the operation in a recall mode in the NVDRAM memory device. The components in these figures identical to those shown in FIG. 19 bear the reference numerals identical thereto.

In the present example, the NVDRAM memory device having a memory cell with a one transistor per cell structure will be described. In this NVDRAM memory device, each memory cell has a ferroelectric. However, the present invention is not limited to this structure; an EEPROM cell, etc. can be used instead of using such a ferroelectric type memory cell.

As shown in FIG. 2, the NVDRAM includes a plurality of word lines WL, plate lines PT corresponding thereto, and a plurality of pairs of bit lines bit and $\overline{bit}$. Each memory cell 4 is positioned in each intersection of the word lines WL, the plate lines PT, and the pair of bit lines bit and $\overline{bit}$. One pair of bit lines bit and $\overline{bit}$ is connected to one sense amplifier 3. One dummy cell 11 is provided for the adjacent two bit lines bit; and another dummy cell 11 is provided for the adjacent two bit lines $\overline{bit}$.

As shown in FIGS. 3A and 3B, each memory cell 4 is constituted by one capacitor C and one selecting transistor Q. One terminal of the capacitor C is connected to the bit line bit or the bit line $\overline{bit}$ through the selecting transistor Q; and the other terminal of the capacitor C is connected to the plate line PT. A gate of the selecting transistor Q is connected to the word line WL. The dummy cell 11 is constituted by one capacitor $C_D$ and two selecting transistors $Q_D$. One terminal of the capacitor $C_D$ is connected to the adjacent two bit lines bit or $\overline{bit}$ through the two selecting transistors $Q_D$, respectively. The other terminal of the capacitor $C_D$ is connected to a dummy cell plate line $PT_D$. A gate of each selecting transistor $Q_D$ is connected to a dummy cell selective line $\phi_D$ (i.e., a dummy cell selective line $\phi_{DL}$ or a dummy cell selective line $\phi_{DR}$). The capacitor $C_D$ of the dummy cell 11 has the same configuration and capacitance as those of the capacitor C of the memory cell 4.

Here, the structure of a control portion of the NVDRAM memory device will be described with reference to FIG. 1, specifically based on one memory cell 4 connected to a certain bit line bit and one dummy cell 11 connected to the bit line $\overline{bit}$ corresponding to the certain bit line bit.

In FIG. 1, the word line WL connected to a gate of the selecting transistor Q of the memory cell 4 is connected to the word line decoder 1. The dummy cell selective line $\phi_D$ is connected to a gate of the selecting transistor $Q_D$ of the dummy cell 11. The plate line PT connected to a plate electrode of the capacitor C of the memory cell 4 is connected to a plate line decoder 2. A storage node of the capacitor C is connected to the selecting transistor Q. The dummy cell plate line $PT_D$ is connected to a plate electrode of the capacitor $C_D$ of the dummy cell 11. A storage node of the capacitor $C_D$ is connected to the selecting transistor $Q_D$. The dummy cell selective line $\phi_D$ is connected to the word line decoder 1, and the dummy cell plate Line $PT_D$ is connected to the plate line decoder 2. Some of these connections are not shown in FIG. 1.

The word line decoder 1 and the plate line decoder 2 respectively selects one word line WL and one plate line PT corresponding to the word line WL, based on an address input to the address buffer 5. Data is transmitted to and received from an external device by the sense amplifier 3 through the data I/O interface. The bit lines bit and $\overline{bit}$ are connected to the sense amplifier The address buffer 5, the sense amplifier 3, the data I/O interface, etc. are controlled by the DRAM mode timing control circuit 7, the recall mode timing control circuit 8, and the store mode timing control circuit 9. The DRAM mode timing control circuit 7 works for allowing the memory cell 4 to be accessed in a volatile DRAM mode. The recall mode timing control circuit 8 works for reading non-volatile data from the memory cell 4 in a recall mode. The store mode timing control circuit 9 works for writing non-volatile data in the memory cell 4 in a store mode.

Either one of the DRAM mode timing control circuit 7, the recall mode timing control circuit 8, and the store mode timing control circuit 9 is selected based on a control signal input to the control signal input buffer 6. A first output of the control signal input buffer 6 is connected to one input of an OR circuit 12 and a reset input R of a recall counter 13. An output of the OR circuit 12 is connected to an input of the DRAM mode timing control circuit 7. A second output of the control signal input buffer 6 is connected to a common terminal of a first switching circuit 14, a count input CL of the recall counter 13, and a reset input R of a store counter 15. A third output of the control signal input buffer 6 is connected to a common terminal of a second switching circuit 16 and a count input CL of the store counter 15. A normal close terminal of the first switching circuit 14 is connected to the recall mode timing control circuit 8, and a normal open terminal of the first switching circuit 14 is connected to the other input of the OR circuit 12. A normal close terminal of the second switching circuit 16 is connected to the store mode timing control circuit 9. A normal open terminal of the second switching circuit 16 remains unconnected.

Figure 4A:
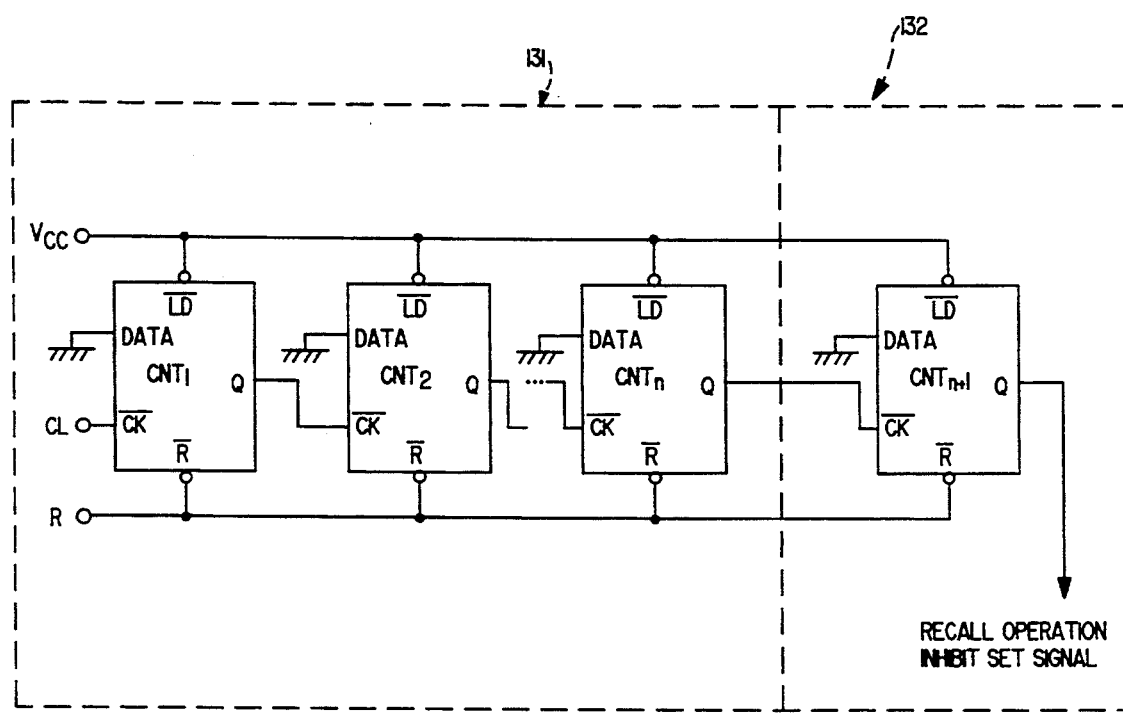
FIG. 4A is a circuit diagram showing an example of a recall counter according to the present invention.

An example of the recall counter 13 is shown in FIG. 4A. In this example, parallel load counters ($CNT_1$ through $CNT_n$) are cascaded together to construct an n-bit counter 131. The recall counter 13 counts the input number of a recall mode selection signal input to the counter input CL of the recall counter 13. The (n+1)th load counter is an inhibit signal generating circuit portion 132 of the recall counter 13. The inhibit signal generating circuit portion 132 generates a carry signal of the n-bit counter 131. This carry signal becomes an inhibit recall signal. When a DRAM mode selection signal is input to the reset input R of the recall counter 13, the recall counter 13 is reset.

When the input number of the recall mode selection signal exceeds the number of the word lines WL, the inhibit recall signal is given to the first switching circuit 14. The first switching circuit 14 is switched so that the common terminal is connected to the normal open terminal. Thus, any recall operation more than necessary can be inhibited.

The recall counter 13 is not limited to the structure shown in the present example, and can be constituted by another circuit. For example, the inhibit signal generating circuit portion 132 can be provided with a plurality of load counters, and an inhibit recall signal can be output from the (n+2)th or (n+3)th load counters. In this case, the acceptable number of the repetition of consecutive recall operations can be increased. Alternatively, the results of a logical operation (AND, OR) of an output from a plurality of load counters may be output as an inhibit recall signal. In this case, the acceptable number of the repetition of consecutive recall operations can be arbitrarily set.

The store counter 15 can be constructed in the same way as in the recall counter 13. For example, parallel load counters ($CNT_1$ through $CNT_n$) are cascaded together to construct an n-bit counter (not shown). The store counter 15 counts the input number of a store mode selection signal input to the count input CL of the store counter 15. The (n+1)th load counter is an inhibit signal Generating circuit portion of the store counter 15. The inhibit signal generating circuit portion generates a carry signal of the n-bit counter. This carry signal becomes an inhibit recall signal. When a recall mode selection signal is input to the reset input R of the store counter 15, the store counter 15 is reset.

When the input number of the store mode selection signal exceeds the number of the word lines WL, the inhibit store signal is Given to the second switching circuit 16. The second switching circuit 16 is switched so that the common terminal is connected to the normal open terminal. Thus, any store operation more than necessary can be inhibited.

The store counter 15 is not limited to the structure shown in the present example, and can be constituted by another circuit. For example, the inhibit signal generating circuit portion can be provided with a plurality of load counters, and an inhibit store signal can be output from the (n+2)th or (n+3)th load counters. In this case, the acceptable number of the repetition of consecutive store operations can be increased. Alternatively, the results of a logical operation (AND, OR) of an output from a plurality of load counters may be output as an inhibit store signal. In this case, the acceptable number of the repetition of consecutive store operations can be arbitrarily set.

In (1) to (3) of FIG. 4B, circuits which can be used as the switching circuits 14 and 16 are shown. In either circuit, when a signal input to an input B is LOW, a signal input to the input A is output from an output D. On the contrary, when a signal input to the input B is HIGH, a signal input to the input A is output from the output C. These circuits are equivalent to that shown in (4) of FIG. 4B.

When the DRAM mode selection signal is output from the control signal input buffer 6, or when the recall counter 13 switches the first switching circuit 14 so that the common terminal of the first switching circuit 14 is connected to the normal open terminal and the control signal input buffer 6 outputs the recall mode selection signal through the first switching circuit 14, the DRAM mode selection signal is input to the DRAM mode timing control circuit 7 through the OR circuit 12. While the recall mode selection signal is being output from the control signal input buffer 6 after the recall counter 13 is reset until the input number of the recall mode selection signal exceeds the number of the word lines WL, the recall mode selection signal continues to be input to the recall mode timing control circuit 8. While the store mode selection signal is being output from the control signal input buffer 6 after the store counter 15 is reset until the input number of the store mode selection signal exceeds the number of word lines WL, the store mode selection signal continues to be input to the store mode timing control circuit 9.

Hereinafter, the operation of the NVDRAM shown in FIG. 1 will be described, in the case where a word line $WL_1$ and a plate line $PT_1$ corresponding to the word line $WL_1$ are respectively selected by the word line decoder 1 and the plate line decoder 2 based on an address input to the address buffer 5 and thereafter, the memory cell 4 connected to the word line $WL_1$ and the plate line $PT_1$ is accessed.

When the DRAM mode is selected, the plate line $PT_1$ and the dummy cell plate line $PT_D$ are grounded in accordance with a signal output from the DRAM mode timing control circuit 7. Consequently, as shown in FIG. 5, the plate line $PT_1$ and the dummy cell plate line $PT_D$ are kept at 0 V. While a signal line $\phi_{EQ}$ shown in FIGS. 3A and 3B is applied with a voltage of $V_{cc}$, the bit lines bit and $\overline{bit}$ are grounded, so that the electric potential of the bit lines bit and $\overline{bit}$ are 0 V. At the beginning of the DRAM mode, a signal line $\phi_p$ is grounded, so that the capacitor $C_D$ of the dummy cell 11 is precharged to $V_{cc}$.

Next, when the electric potentials of the word line $WL_1$ and a dummy cell word line $D_{WR}$ reach $V_{cc}+V_{th}$, an electric charge stored in the capacitor of the memory cell 4 connected to the word line $WL_1$ is read out to the bit line bit. Therefore, the electric potential of the bit line bit is increased, as shown in FIG. 5. When the electric potentials of the word line $WL_1$ and the dummy cell word line $D_{WR}$ reach $V_{cc}+V_{th}$, that of the dummy cell selective line $\phi_{DR}$ reaches $V_{cc}$ and the electric charge stored in the capacitor $C_D$ of the dummy cell 11 precharged to $V_{cc}$ is read out to two bit lines $\overline{bit}$. Therefore, the electric potentials of the two bit lines $\overline{bit}$ are increased, as shown in FIG. 5. The electric charge stored in one dummy cell 11 is read out to the two bit lines $\overline{bit}$, so that the electric potential of each bit line $\overline{bit}$ is between the electric potential of the bit line bit and 0 V. The electric potential of a signal line $\phi_{IS}$ reaches $V_{cc}+V_{th}$ and that of a signal line $\phi_{SEN}$ reaches $V_{cc}$ in accordance with the increase in the electric potential of the bit lines bit and $\overline{bit}$. When the difference in electric potential between the bit line bit and the bit line $\overline{bit}$ is detected by the sense amplifier 3, the respective electric potentials of the bit line bit and the bit line $\overline{bit}$ are set at $V_{cc}$ or 0 V, based on the data stored in the memory cell 4.

In the store mode, as shown in FIG. 6, a pulse voltage signal changing from 0 V to $V_{cc}$ to 0 V is applied to the plate line $PT_1$ and the dummy cell plate line $PT_D$ based on a signal output from the store mode timing control circuit 9, after the read operation in the DRAM mode. In the case where the store mode is selected, the read operation in the DRAM mode is performed. After volatile data of the memory cell 4 is output to the bit lines bit and $\overline{\text{bit}}$, a pulse voltage signal is applied to the plate line $PT_1$. The polarization state of the ferroelectric of the capacitor C is changed from the point E to the point B to the point C or from the point D to the point E to the point D (see FIG. 18) by the application of the pulse voltage signal. In this way, the polarization inversion of the ferroelectric in accordance with data to be stored in the memory cell 4 is performed. The data is restored in the memory cell 4 in a non-volatile manner by the polarization inversion. Thereafter, the polarization state of the ferroelectric of the capacitor $C_D$ of the dummy cell 11 is changed so as to move to the point E (see FIG. 18) by applying a pulse voltage to the dummy cell plate line $PT_D$ during the precharge operation.

In the recall mode, the electric potential of the signal line $\phi_{EQ}$ reaches $V_{cc}$ in accordance with a signal output from the recall mode timing control circuit 8 and the bit lines bit and $\overline{\text{bit}}$ are grounded, as shown in FIG. 7. At the beginning of the recall mode, the signal line $\phi_P$ is also grounded, so that the capacitor $C_D$ of the dummy cell 11 is precharged to $V_{cc}$. Then, the electric potentials of the word line $WL_1$ and the dummy cell line $D_{WR}$ are shifted to $V_{cc}+V_{th}$. The electric potential of the signal line $\phi_{EQ}$, which has reached 0 V, reaches $V_{cc}$ again in synchronization with this shift. Therefore, the electric charge stored in the capacitor C of the memory cell 4 is discharged.

Figure 18:
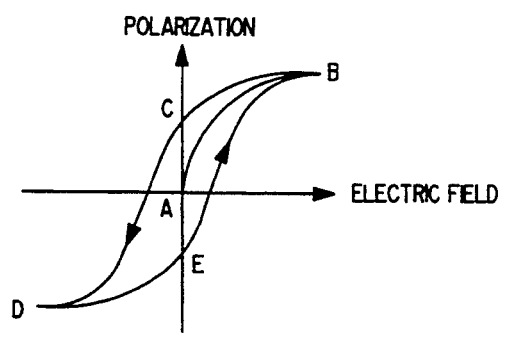
FIG. 18 shows a hysteresis characteristic curve of a ferroelectric in a capacitor of a memory cell.

When a voltage signal of $V_{cc}$ is applied to the plate line $PT_1$, the polarization state of the ferroelectric of the capacitor C of the memory cell 4 moves from the point C to the point B or from the point E to the point B (see FIG. 18). Therefore, the electric potential of the bit line bit is increased in accordance with the data stored in the memory cell 4. When the electric potential of the dummy cell plate line $PT_D$ reaches $V_{cc}$, the polarization state of the ferroelectric of the capacitor $C_D$ of the dummy cell 11 moves from the point E to the point B as shown in FIG. 18. Consequently, the electric potential of the bit line $\overline{\text{bit}}$ is increased. The electric charge stored in one dummy cell 11 is read out to two bit lines $\overline{\text{bit}}$, so that the electric potential of the respective bit lines $\overline{\text{bit}}$ is between the electric potential of the bit line bit and 0 V. When the electric potential of the plate line $PT_1$ reaches 0 V, the electric potentials of the bit lines bit and $\overline{\text{bit}}$ are slightly decreased in accordance with the change of the electric potential of the plate line $PT_1$.

On the other hand, after the electric potential of the signal line $\phi_{IS}$ reaches $V_{cc}+V_{th}$ in synchronization with the change of the electric potential of the plate line $PT_1$, the electric potential of the signal line $\phi_{SEN}$ reaches $V_{cc}$. When the signal line $\phi_{SEN}$ is at $V_{cc}$, the sense amplifier detects the electric potential difference between the bit lines bit and $\overline{\text{bit}}$. As a result, the electric potential of the bit lines bit and $\overline{\text{bit}}$ are set at $V_{cc}$ or 0 V based on the data stored in the memory cell 4, whereby data is read out.

As described above, the data which is destructively read out can be restored in the identical memory cell 4 in a non-volatile manner by applying a pulse voltage to the plate line $PT_1$ again. That is, the data read out in the recall mode is held again in the memory cell 4. However, in the case where the memory cell 4 which restores the data in a non-volatile manner is once accessed in the DRAM mode, the data stored in a non-volatile manner is destroyed. More specifically, the polarization state of the ferroelectric at the point C or the point E returns to the point E after moving to the point D, so that the non-volatile data in the memory cell 4 is destroyed. The dummy cell plate line $PT_D$ is applied again with a pulse voltage signal during the precharge operation after the access in the DRAM mode, whereby the polarization state of the ferroelectric of the capacitor $C_D$ of the dummy cell 11 is moved to the point E, as shown in FIG. 18.

As described above, when the recall mode timing control circuit 8 successively controls all of the word lines WL in the recall mode, the count value of the recall counter 13 reaches the number of the word lines WL. In the normal operation, the count value of the recall counter 13 is reset when the DRAM mode timing control circuit 7 controls the word lines WL in the DRAM mode. In the case where the recall mode is selected again after this reset through the control signal input buffer 6, a signal for designating the execution of the control in the recall mode is output from the recall mode timing control circuit 8. Even in the case where the power source is turned OFF after the control in the store mode is executed without the control in the DRAM mode, the count value of the recall counter 13 is reset at a time when the power source is subsequently turned ON.

When the store mode timing control circuit 9 successively controls all of the word lines WL in the store mode, the count value of the store counter 15 reaches the number of the word lines WL. In normal operation, a signal for executing the control in the recall mode is output from the recall mode timing control circuit 8 and the count value of the store counter 15 is reset in accordance with the signal thus output. Therefore, when a signal for selecting the store mode is input through the control signal input buffer 6, the store mode timing control circuit 9 can execute the control in the store mode. In the case where the power source is turned OFF without the execution of the control in the recall mode, the count value of the store counter 15 is reset at a time when the power source is turned ON.

In general, the stored data is read out when the power source is turned ON, so that the count value of the store counter 15 may be set at a time when the power source is turned ON and the common terminal may be connected to the normal open terminal in the second switching circuit 16. As a result, the stored data is safely guarded, since the store operation right after the power source is turned ON is inhibited.

In the case where the bugs in a program or the runaway of a computer device controlling the NVDRAM memory device is caused, the recall mode or the store mode operations may be repeatedly commanded. In the NVDRAM memory device of the present invention, in such a case, the recall counter 13 or the store counter 15 continue to count the number of operations without being reset. As a result, the count value exceeds the number of the word lines WL. When the count value exceeds the number of the word lines WL, the common terminal of the first switching circuit 14 or the second switching circuit 16 is switched so as to be connected to the normal open terminal. Therefore, the recall mode or the store mode operations are not executed more than necessary by the recall mode timing control circuit 8 or the store mode timing control circuit 9.

When the count value of the recall counter 13 exceeds the number of the word lines WL, the common terminal of the first switching circuit 14 is switched so as to be connected to the normal open terminal. Consequently, a signal for selecting the recall mode through the control signal input buffer 6 is input to the DRAM mode timing control circuit 7 through the OR circuit 12 (see FIG. 1). Thus, data is read in the DRAM mode which does not involve the polarization inversion of the ferroelectric, instead of being read in the recall mode which involves the polarization inversion of the ferroelectric, and the volatile data read by the first operation in the recall mode is repeatedly read out.

As described above, in the NVDRAM memory device of the present invention, even though the recall mode or the store mode is repeatedly commanded more than necessary due to the bugs in a program or the runaway of a computer device, the recall operation or the store operation is inhibited. Thus, the polarization inversion of the ferroelectric due to the bugs in a program or the runaway of a computer device is not repeated more than necessary, preventing the life time of the memory cell from being shortened.

In the recall mode, the non-volatile data is once destroyed due to the destructive read. However, the non-volatile data is restored in the memory cell 4 in a non-volatile manner after being read, the data being safely guarded. Further, the non-volatile data is read after an electric charge stored in the capacitor of the memory cell 4 is discharged in the recall mode. Therefore, noise due to the stored electric charge is removed and non-volatile data can be read out accurately.

In the present example, the memory cell 4 has one transistor per cell structure, using the dummy cell 11. The respective dummy cell 11 is connected to the adjacent two bit lines bit or $\overline{\text{bit}}$; therefore, the dummy cell 11 can have the same configuration as that of the memory cell 4, making it easy to produce the NVDRAM memory device.

Figure 19:
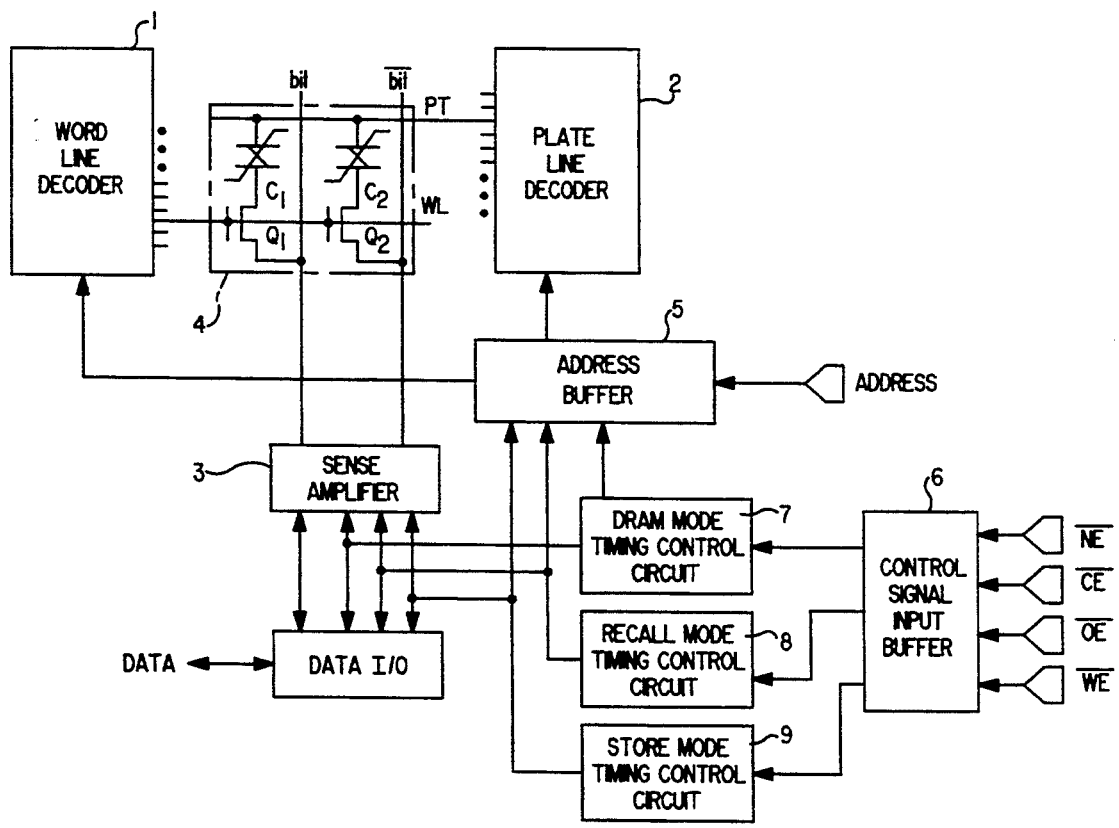
FIG. 19 is a block diagram showing the structure of a control portion of a conventional NVDRAM memory cell.

Although present example is described with respect to the NVDRAM cell using one transistor per cell structure, the present example can be applied to the NVDRAM cell using a 2 transistors per cell structure as shown in FIG. 19.

EXAMPLE 2

The page store method according to the present invention will be described.

In the present example, a page store start address is given to a counter circuit through an address selector circuit. A signal output from the counter circuit is input to the address selector circuit again and transmitted to an address decoding circuit to be used as an actual page store start address.

The page store start address can be addressed through an external address pad, for example. A user can choose to perform a store operation for memory cells corresponding to only one page starting from the address or to perform a store operation for memory cells corresponding to several pages starting from the address. In each store operation, data is stored in only one memory cell per bit line. Alternatively, the signal generated inside a page store device can be used as the page store start address. More specifically, a count initial value of the counter circuit can be arbitrarily set, so that the memory cell array is divided into some regions and the store operation can be performed with respect to a certain region among them. Moreover, the certain region where the store operation is performed can be changed and arbitrarily selected.

Compared with the case where the store operation is performed for all of the memory cells in the NVDRAM memory device, it is more effective, in most cases, that the store operation is performed for only the memory cells corresponding to the desired pages. For example, the memory cells in the NVDRAM memory device are divided into some sections. Each section functions independently, and can be used independently of the other sections. Thus, it is more effective that data of pages constituting a certain section is stored, compared with the case where data of all of the pages constituting all of the sections is stored. In addition, since the store operation is performed for each section; the wasteful number of the polarization inversions is decreased, compared with the case where each store operation is performed for all of the memory cells.

Hereinafter, the page store device according to the present invention will be described with reference to the drawings.

Figure 11:
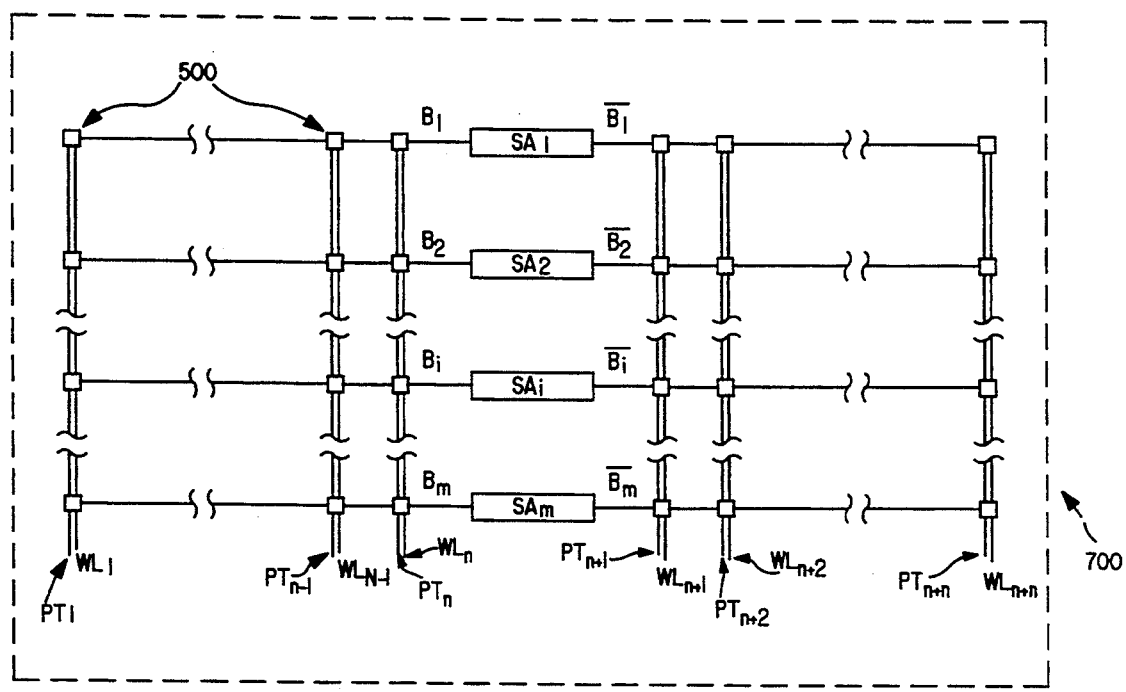
FIG. 11 is a diagram showing a memory cell array of the NVDRAM in which the page store device according to the present invention is provided.

FIG. 11 shows an array of memory cells 500 of an NVDRAM memory device in which the page store device according to the present invention is provided. The memory cells 500 are connected along bit lines $B_1$ through $B_m$, plate lines $PT_1$ through $PT_{n+n}$, and word lines $WL_1$ through $WL_{n+n}$.

Figure 20A:
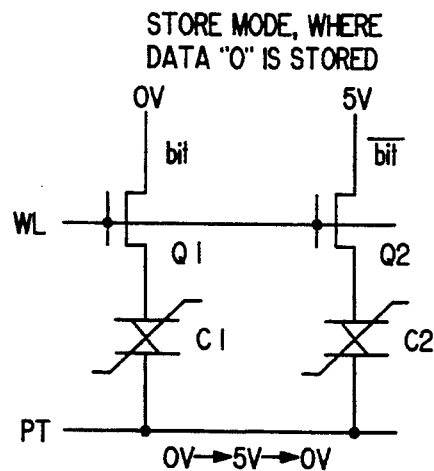
FIG. 20A is a circuit diagram of a memory cell having two transistors per cell, illustrating the operation in the case where the data "0" is stored.
Figure 20B:
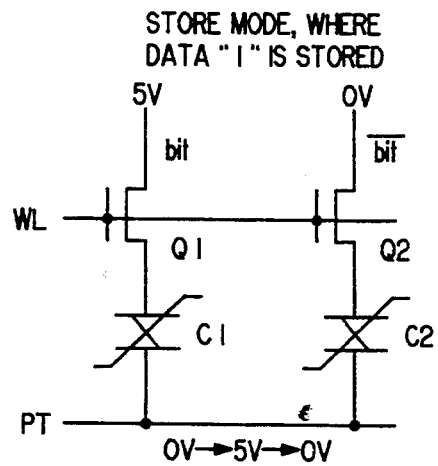
FIG. 20B is a circuit diagram of a memory cell having two transistors per cell, illustrating the operation in the case where the data "1" is stored.
Figure 20C:
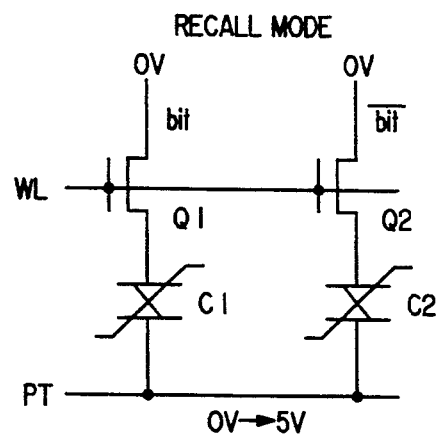
FIG. 20C is a circuit diagram of a memory cell having two transistors per cell, illustrating a recall mode.
Figure 21:
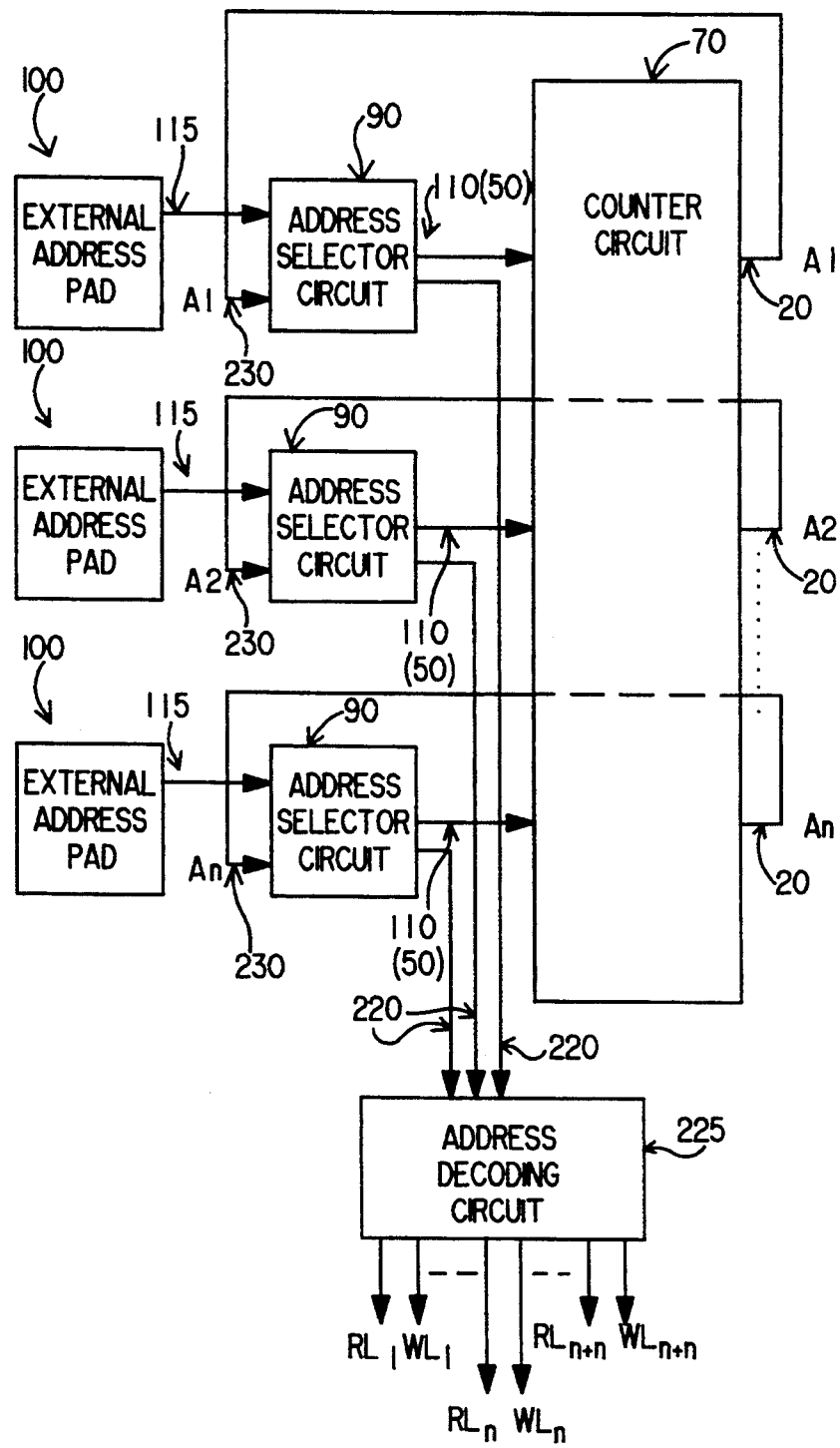
FIG. 21 is a block diagram showing a main portion of a conventional page recall device.

The word lines $WL_1$ through $WL_{n+n}$ are used to address the memory cells 500, in a manner to be described in detail below, and the bit lines $B_1$ through $B_m$ are used to recall data stored in the memory cells 500. As for the memory cells 500, those shown in FIG. 20A or memory cells obtained by modifying those shown in FIG. 20A so as to include one transistor and one capacitor are preferred. Other NVDRAM cell designs may be used. For example, the memory cells 500 can be arranged in the same array as that shown in FIG. 11, are addressed by word lines or equivalents thereof, and undergo store operations by means of plate lines or equivalents thereof. The set of the memory cells 500 connected to the respective bit lines $B_1$ through $B_m$ shown in FIG. 11 corresponds to a first subset (described later), and a set of the memory cells 500 connected to the respective word lines $WL_1$ through $WL_{n+n}$ corresponds to a second subset (described later).

Figure 8:
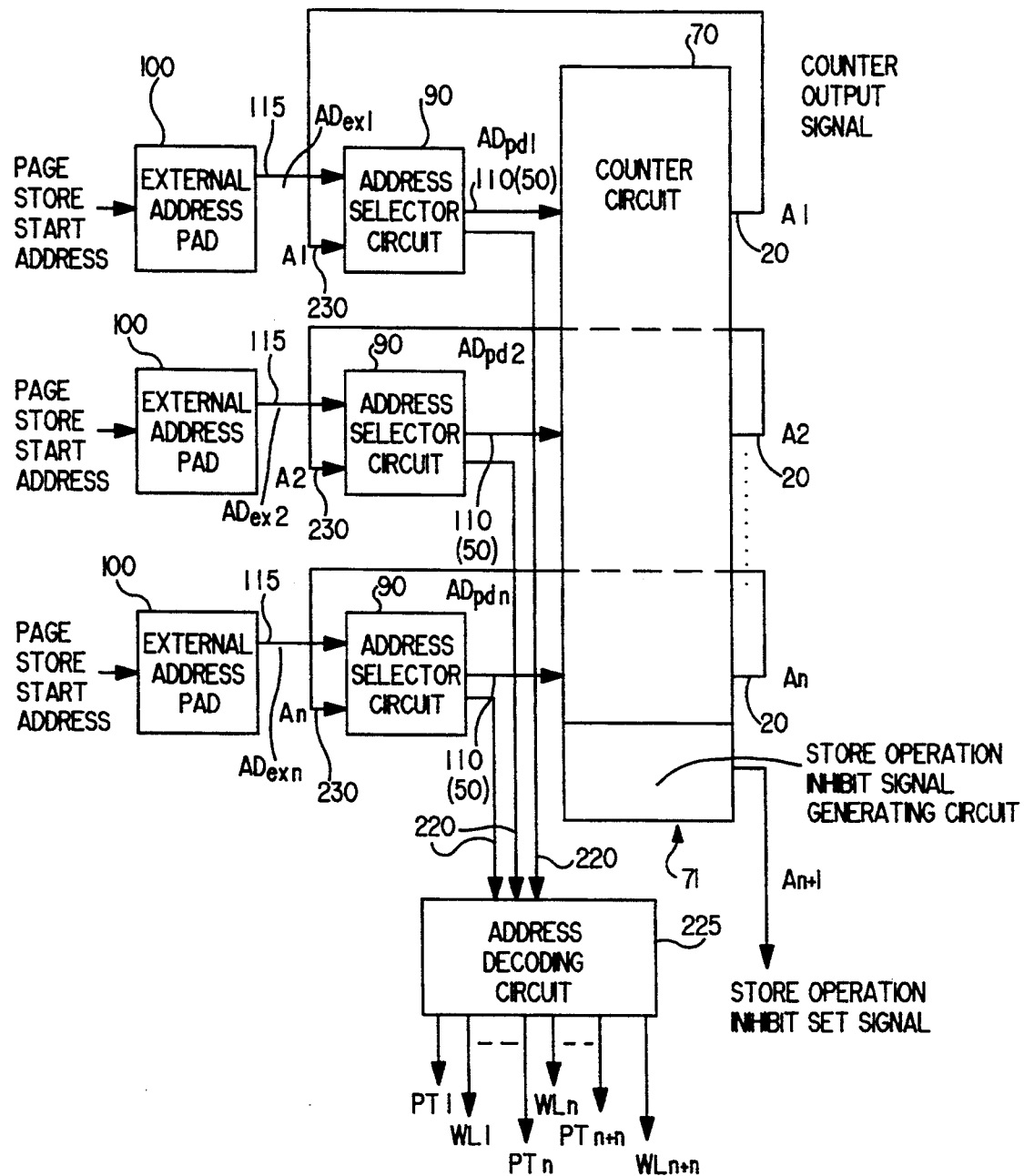
FIG. 8 is a block diagram showing a main portion of a page store device according to the present invention.

FIG. 8 is a block diagram showing the page store device according to the present invention. The page store device will be described with reference to FIG. 11. At a certain time, one of the word lines $WL_1$ through $WL_{n+n}$ (e.g., $WL_i$, where $1 < i < n+n$) is addressed, and then all of the bit lines $B_1$ through $B_m$ are activated. Thereafter, a plate line (i.e., $PT_i$) related to the activated word line $WL_i$ is activated. Data is stored in the memory cells 500 on the activated word line $WL_i$.

Figure 9:
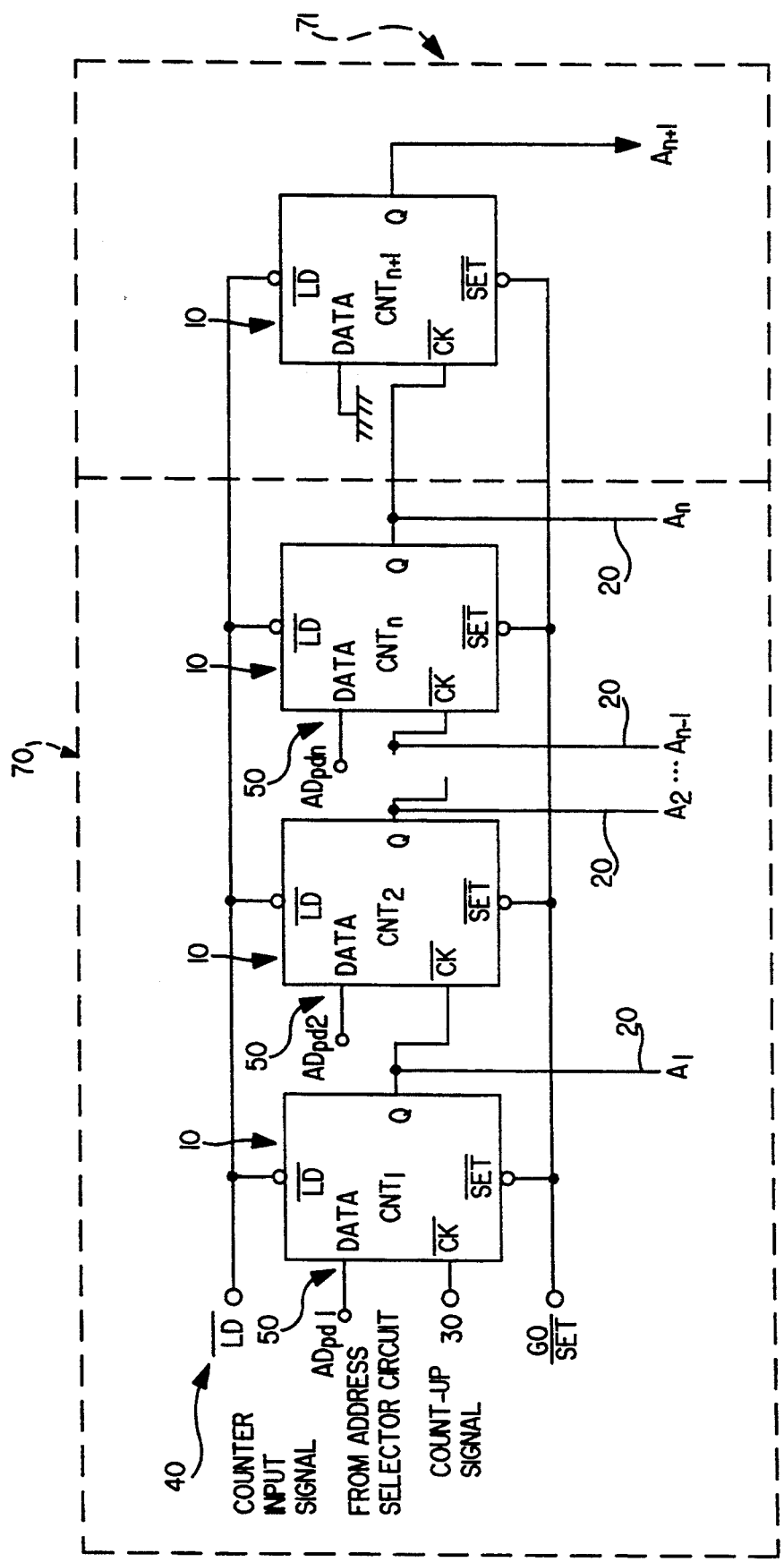
FIG. 9 is a counter circuit and a store operation inhibit signal generating circuit provided in the page store device according to the present invention.
Figure 10:
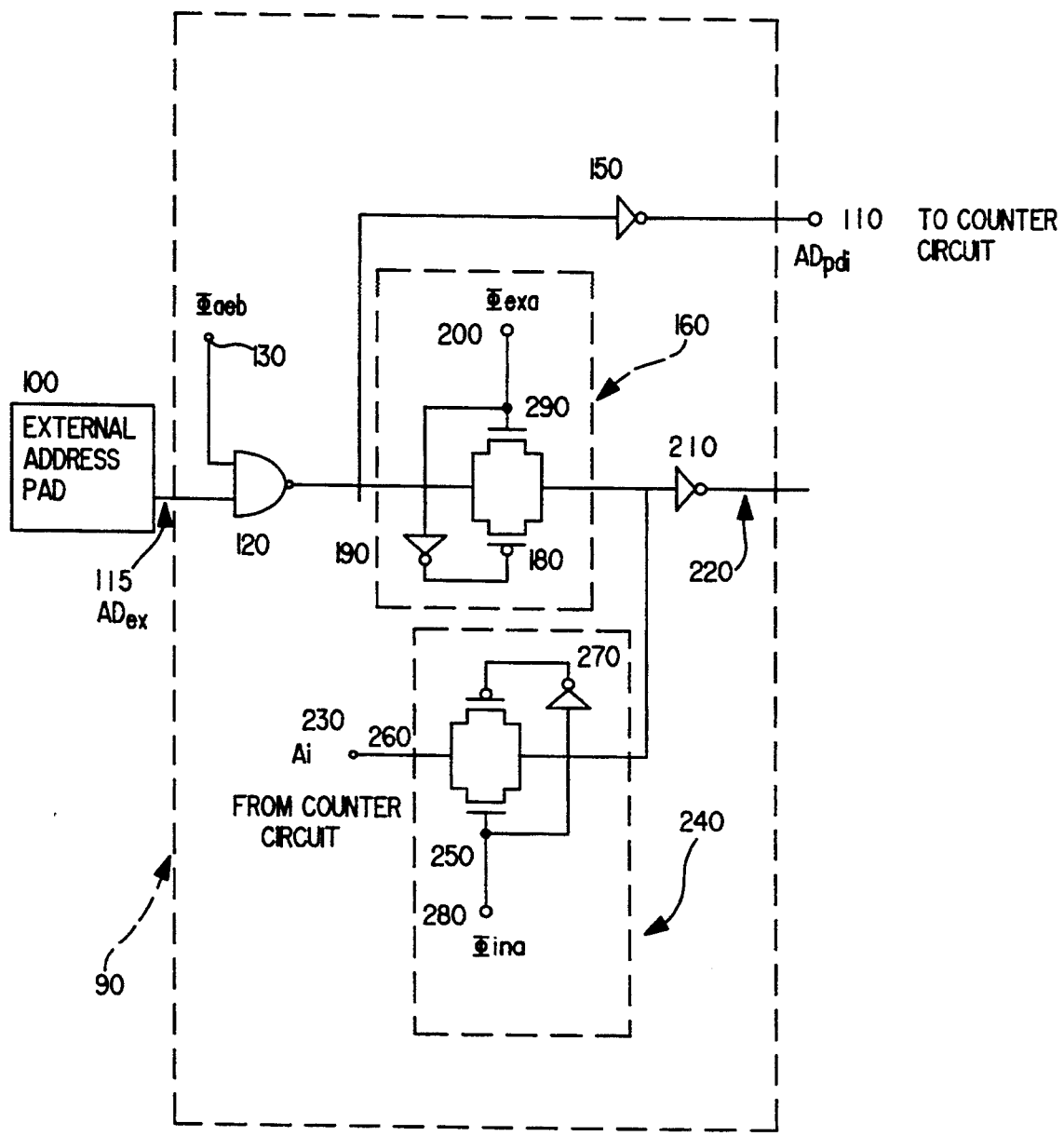
FIG. 10 is a circuit diagram showing an address selector circuit provided in the page store device according to the present invention.

Referring to FIG. 8, the page store device includes external address pads 100, address selector circuits 90, a counter circuit 70, a store operation inhibit signal generating circuit 71, and an address decoding circuit 225. The structure of the address selector circuit 90 is shown in FIG. 10, and those of the counter circuit 70 and the store operation inhibit signal generating circuit 71 are shown in FIG. 9.

The external address pad 100, the address selector circuit 90, the address signal ($AD_{ex}$) 115, the second start address signal ($AD_{pd}$) 110 are respectively present in a plurality of numbers. Hereinafter, for simplicity, exemplary one of them will be described (where subscripts are omitted as long as it can be understood).

The external address pad 100 outputs the address signal ($AD_{ex}$) 115 which corresponds to a predetermined page store start address input to the external address pad 100. The address signal ($AD_{ex}$) 115 output from the external address pad 100 is input to the address selector circuit 90 as the second start address signal ($AD_{pd}$) 110. The second start address signal ($AD_{pd}$) 110 is given, as a counter input signal 50, to the respective load counters 10 of the counter circuit 70 shown in FIG. 9. On the other hand, the address signal 115 is output as an output signal 220 from the address selector circuit 90 to be given to the address decoding circuit 225. The address the plate lines $PT_1$ through $PT_{n+n}$ and a signal to be given to the word lines $WL_1$ through $WL_{n+n}$. Preferably, only one of the plate lines $PT_1$ through $PT_{n+n}$ and one of the word lines $WL_1$ through $WL_{n+n}$ will be a logic 1, the others being a logic 0, as discussed below.

The number of external address pads 100 is determined by the number of the plate lines PT and that of the word lines WL. In the preferred embodiment, there are n+n word lines and n+n plate lines, and the external address pad 100 generates a binary representation of the signals provided to these lines, so that there are $log_2(n+n)$ (or $1+log_2 n$) external address pads 100.

FIG. 9 is a block diagram showing the counter circuit 70 and the store operation inhibit signal generating circuit 71. The counter circuit 70 has n load counters ($CNT_1$ through $CNT_n$) 10 to construct an n-bit counter which outputs counter output signals $A_1$ through $A_n$. Each load counter 10 has an output Q and inputs: a data input for signal DATA, a clock input for signal $\overline{CK}$, a load input for signal $\overline{LD}$, and a set input for signal $\overline{SET}$. Except for the load counter $CNT_{n+1}$ for the store operation inhibit signal generating circuit 71, the output Q of each load counter ($CNT_1$ through $CNT_n$) 10 is connected to a clock input $\overline{CK}$ of the subsequent load counters 10.

The load counters ($CNT_1$ through $CNT_{n+1}$) 10 in the counter circuit 70 and the store operation inhibit signal generating circuit 71 increase counter output signals $A_1$ through $A_{n+1}$ by 1, every time a count-up signal 30 is pulsed. The count-up signal 30 is used for a write enable signal $\overline{WE}$ (described later). Every time each load signal $\overline{LD}$ goes to a low level, in the counter circuit 70, the counter input signals ($AD_{pd1}$ through $AD_{pdn}$) 50 are respectively loaded onto address lines 20 for transmitting counter output signals $A_1$ through $A_n$. The counter output signals $A_1$ through $A_n$ are output through the address selector circuit 90 as the output signals 220 and are given to the address decoding circuit 225 to contribute to the generation of a signal to be given to the word lines WL. Finally, sending a set signal input into $\overline{SET}$ to a low level resets the counter output signals $A_1$ through $A_{n+1}$ to logic 0s.

When the address signal ($AD_{ex}$) 115 is input to the address selector circuit 90 from the external address pad 100, the address selector circuit 90 gives the second start address signal ($AD_{pd}$) 110, which corresponds to the address signal ($AD_{ex}$) 115, to both of the counter circuit 70 and the address decoding circuit 225 or either of the counter circuit 70 or the address decoding circuit 225, in accordance with the internal state of the address selector circuit 90. More specifically, the address signal 115 is transmitted to the counter circuit 70 as the second start address signal ($AD_{pd}$) 110 and is sent back to the address selector circuit 90 to be transmitted to the address decoding circuit 225. This procedure, as described below, allows addresses to be selected arbitrarily by a user, or automatically generated by the apparatus of the present invention.

FIG. 10 is a circuit diagram of one address selector circuit 90, which interfaces between the external address pad 100 and the counter circuit 70. This circuit diagram shows the address selector circuit 90 with respect to the ith second start address signal ($AD_{pdi}$) 110. The address selector circuit 90 is provided for each address signal 115. In the case of n address lines 20, n address selector circuits 90 are provided in the page store device. The address selector circuit 90 has a NAND gate 120. The address signal ($AD_{exi}$) 115 from the external address pad 100, corresponding to the second start address signal ($AD_{pdi}$) 110, is Given to one input of the NAND gate 120. To the other input terminal 130, an address enable signal $\Phi_{aeb}$ is given.

An output signal from the NAND gate 120 is transmitted to the counter circuit 70 as the second start address signal ($AD_{pdi}$) 110 via an inverter 150. An output signal from the NAND gate 120 is also transmitted to a transmission gate 160. The transmission Gate 160 includes an n-channel MOS transistor 290, a p-channel MOS transistor 180, and an inverter 190. A source of the n-channel MOS transistor 290 is connected to a drain of the p-channel MOS transistor 180; a drain of the n-channel MOS transistor 290 is connected to a source of the p-channel MOS transistor 180; and a gate of the p-channel MOS transistor 180 is connected to a gate of the n-channel MOS Transistor 290 via the inverter 190. The n-channel MOS transistor 290 is the complement of the p-channel MOS transistor 180. To the gate of the n-channel MOS transistor 290, the external address enable signal $\Phi_{exa}$ is provided from an input terminal 200. The output from the transmission gate 160 is transmitted via the inverter 210 to be the output signal 220. Then, the output signal 220 is input to the external address decoding circuit 225.

The address selector circuit 90 has a transmission gate 240. The transmission gate 240 includes an n-channel MOS transistor 250, a p-channel MOS transistor 260, and an inverter 270. A source of the n-channel MOS transistor 250 is connected to a drain of the p-channel MOS transistor 260, a drain of the n-channel MOS transistor 250 is connected to a source of the p-channel MOS transistor 260, and a gate of the p-channel MOS transistor 260 is connected to a gate of the n-channel MOS transistor 250 via the inverter 270. The n-channel MOS transistor 250 is the complement of the p-channel MOS transistor 260.

The transmission gate 240 is controlled by an internal address enable signal $\Phi_{ina}$ input to the gate of the n-channel MOS transistor 250 via an input 280. An input signal $A_i$ is given to the transmission gate 240 via an input 230, and an output signal from the transmission gate. 240 is transmitted via the inverter 210 to be the output signal 220. The output signal 220 is input to the address decoding circuit 225. The input signal $A_i$ input to the input 230 corresponds to one of the counter output signals $A_1$ through $A_n$ output from the counter circuit 70 onto address lines 20.

Figure 12:
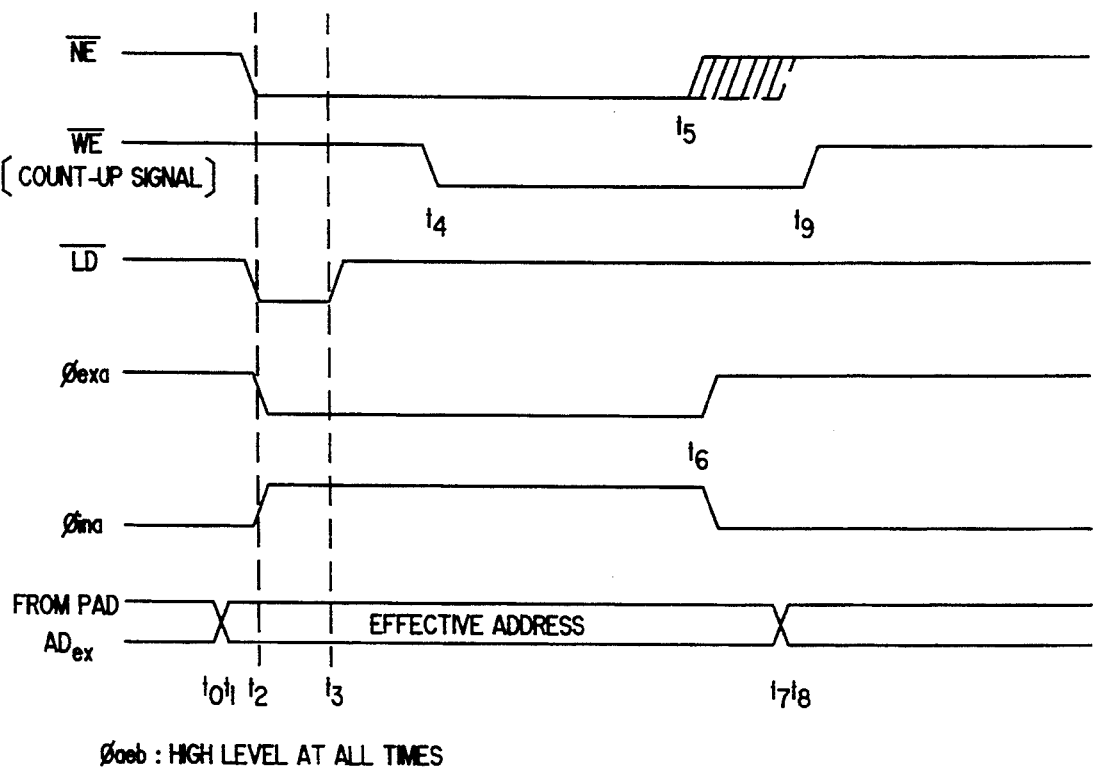
FIG. 12 is a timing chart of various signals used in a page store method using the page store device according to the present invention.

Hereinafter, the operation of the page store device thus constructed will be described with reference to FIG. 12.

From the time $t_0$ to the time $t_1$, a desired page store start address is input to the external address pad 100. At the time $t_2$, an non-volatile enable signal $\overline{NE}$ goes to a low level. As a result, the load signal $\overline{LD}$ is generated, the external address enable signal $\Phi_{exa}$ goes to a low level, and the internal address enable signal $\Phi_{ina}$ goes to a high level. The non-volatile enable signal $\overline{NE}$ switches the level of the external address enable signal $\Phi_{exa}$ and that of the internal address enable signal $\Phi_{ina}$. The non-volatile enable signal $\overline{NE}$ is given to the address selector circuit 90.

The external address enable signal $\Phi_{exa}$ is active (high) during the normal read and write operation of the page store device, but is not active (low) during the page store operation. The internal address enable signal $\Phi_{ina}$ is active (high) during the page store operation, but is not active (low) during the read and write operation of the page store device. The address enable signal $\Phi_{aeb}$ is at a high level at all times during the page store operation.

Since the address enable signal $\Phi_{aeb}$ is at a high level, the address signal $(AD_{exi})$ 115 from the external address pad 100 is inverted through the NAND gate 120 of the address selector circuit 90. At this time, the external address enable signal $\Phi_{exa}$ is at a low level, the transmission gate 160 is turned OFF and the address signal 115 is routed through the inverter 150 and ends up as the second start address signal $(AD_{pdi})$ 110. The second start address signal $(AD_{pdi})$ 110 is given to the counter circuit 70.

The second start address signal $(AD_{pdi})$ 110 becomes the counter input signal 50 to be given to the counter circuit 70. The load signal $\overline{LD}$ is a pulse signal at a low level at the time $t_2$, so that the counter input signal $(AD_{pdi})$ 50 is loaded on the address line 20. Each output signal $A_i$ transmitted via the address line 20 constitutes one page store start address addressed by the external address pad 100, and becomes the input signal $A_i$ which is returned to the address selector circuit 90 via the terminal 230. The load signal LD returns to a high level at the time $t_3$.

The internal address enable signal $\Phi_{ina}$ goes to a high level at the time $t_2$, so that the input signal $A_i$ is transmitted through the transmission gate 240 and the inverter 210. At this time, the input signal $A_i$ is converted to an address signal which can be used as the present start address for the store operation.

At the time $t_4$, the write enable signal $\overline{WE}$ goes to a low level, and the page store device of the present example commands the start of the store operation using the page store start address which has been previously loaded onto the external address pad 100. The page store operation is performed between the times $t_4$ and $t_9$. During this operation, the volatile DRAM data is restored from a degraded state to full logic 0 or 1 voltage level.

At a certain time after $t_5$, the non-volatile enable signal $\overline{NE}$ returns to a high level to be reset. At the time $t_9$, the write enable signal $\overline{WE}$ returns to a high level to be reset. When the non-volatile enable signal $\overline{NE}$ goes to a high level at a certain time (e.g., $t_6$) before $t_9$, the external address enable signal $\Phi_{exa}$ goes to a high level and the internal address enable signal $\Phi_{ina}$ returns to a low level.

Between the time $t_7$ and $t_8$ (after $t_5$), another address may be loaded onto the external address pad 100 in preparation for another store operation. Alternatively at this time, since the write enable signal $\overline{WE}$ also functions as the count-up signal the outputs of the load counters 10 increase by 1 whenever the write enable signal $\overline{WE}$ goes to a high level, for example, at $t_9$. Thus, instead of inputting an address signal for a new store operation from the external address pad 100, one may choose to use the address whose output is increased on the counter circuit 70 to automatically store the next consecutive page.

In this case, during the subsequent page store operation, the internal address enable signal $\Phi_{ina}$ which went to a high level at $t_2$ allows the input signal $A_i$ to be transmitted through the transmission gate 240. The input signal $A_i$ is output as the signal 220 via the inverter 210 to address the next consecutive pages with respect to the address decoding circuit 225. In the page store operation, the address decoding circuit 225 is designed so that only the word line WL and the plate lines PT corresponding thereto will be a logic 1 for a given store operation.

Thus, in the page store device of the present example, as shown in FIG. 11, when a word line $WL_n$ and a plate line $PT_n$, for instance are activated all of the bit lines $B_1$ through $B_m$ are activated and volatile data is detected by the sense amplifiers $SA_1$ through $SA_m$. The sense amplifiers $SA_1$ through $SA_m$ may be conventional ones. Thereafter, the plate line $PT_n$ is used to restore (rewrite) volatile data which was stored in the entire page, i.e., all of the memory cells along the word line $WL_n$.

None of the plate lines PT should be activated except for one plate line $PT_n$ corresponding to the word line $WL_n$ which is being activated. This is because a store operation on other memory cells can destroy the data in those memory cells, there being no restore operation on those memory cells. In view of this, according to the present invention, a memory cell array is designed as follows:

The memory cell array includes a plurality of bit lines, a plurality of word lines, a plurality of plate lines, and a plurality of memory cells. One bit line, one word line, and one plate line are connected to each memory cell. A first subset of memory cells connected to one of the bit lines does not overlap another first subset of memory cells connected to another one of the bit lines, and a second subset of memory cells connected to one of the word lines does not overlap another second subset of another one of the word lines.

In the present example, the NAND gate 120 is used in the address selector circuit 90 and the address enable signal $(\Phi_{aeb})$ 130 is designed to be given to the NAND gate 120. The present invention is not limited to this structure. A NOR gate may be used in the address selector circuit 90; however, in this case, it is required that the polarization (high or low) of the address enable signal $(\Phi_{aeb})$ 130 be inverted.

In addition, according to the present invention, a circuit dedicated to a page store operation can be used as the counter circuit 70 shown in FIG. 9. Alternatively, a refresh counter can be used together with the counter circuit 70. According to the present invention, the store operation inhibit signal generating circuit 71 in FIG. 8 is designed to use a carry signal of the counter circuit 70 in FIG. 9. Other circuit can be used instead of the store operation inhibit signal generating circuit 71.

According to the present invention, as described regarding the counter circuit 70 shown in FIG. 9, the counter input signal 50 (the second start address signal 110) which is input to the counter circuit 70 can be input by a user of the page store device. It can be designed that the counter input signal 50 is automatically generated in a computer or other circuits in the page store device according to the present invention.

In the present example, it is supposed that the electric potential of the plate line PT is 0 V or $V_{cc}$ at all times. However, the present invention is not limited thereto. During the DRAM operation performed after non-volatile data is transformed to volatile data (i.e., during the recall operation after the power source is turned ON), the electric potential of the plate line PT can be set at a value between 0 V and $V_{cc}$ such as $V_{cc}/2$. In this case, there is an advantage that the electric field applied to both terminals of the ferroelectric is alleviated.

During the store operation, by varying the voltage, which is applied to the plate line PT corresponding to the word line WL of the selected memory cell, between 0 V and $V_{cc}$, the ferroelectric of the memory cell has its polarization inverted, whereby data is stored in a non-volatile manner. In the case where the electric potential of the plate line PT is $V_{cc}/2$, the thickness of the ferroelectric film is set so as not to cause the polarization inversion thereof.

Figure 13A:
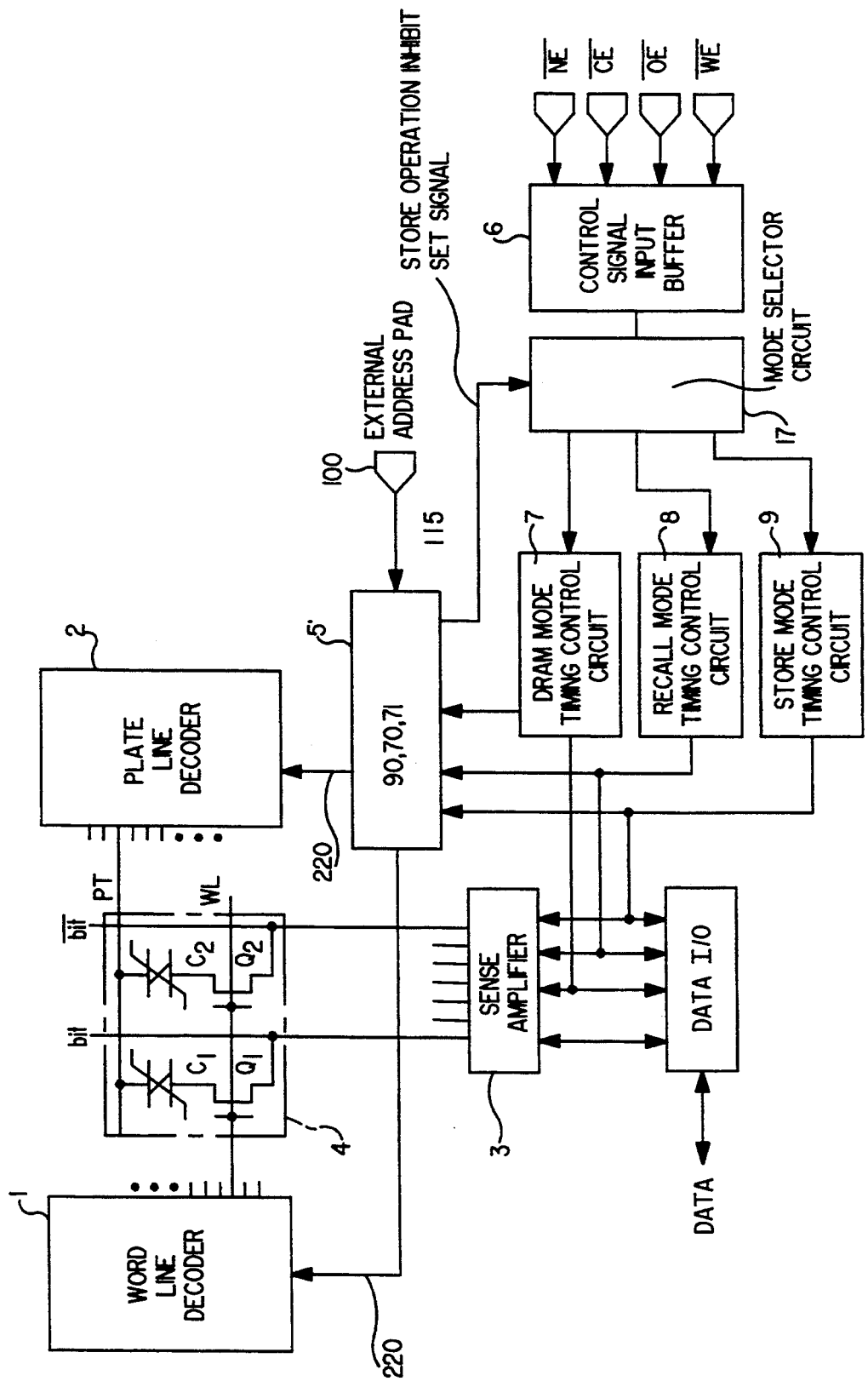
FIG. 13A is a block diagram showing an exemplary case where the page store device according to the present invention is provided in the NVDRAM memory device.

FIG. 13A is a block diagram showing an exemplary case where the page store device of the present example is provided in the NVDRAM memory device. The components identical to those in Example 1 bear the reference numerals identical thereto.

A block 5' of FIG. 13a represents the address selector circuit 90, the counter circuit 70, and the store inhibit signal generating circuit 71. The mode selector circuit 17 selects a mode in accordance with a signal given thereto. Upon receiving a store operation inhibit set signal, the mode selector circuit 17 prevents a signal from being transmitted to the store mode timing control circuit 9. Thus, a store mode is not selected, and a store operation is inhibited. More specifically, the mode selector circuit 17 can be formed of a switching circuit in the same way as in Example 1.

Figure 13B:
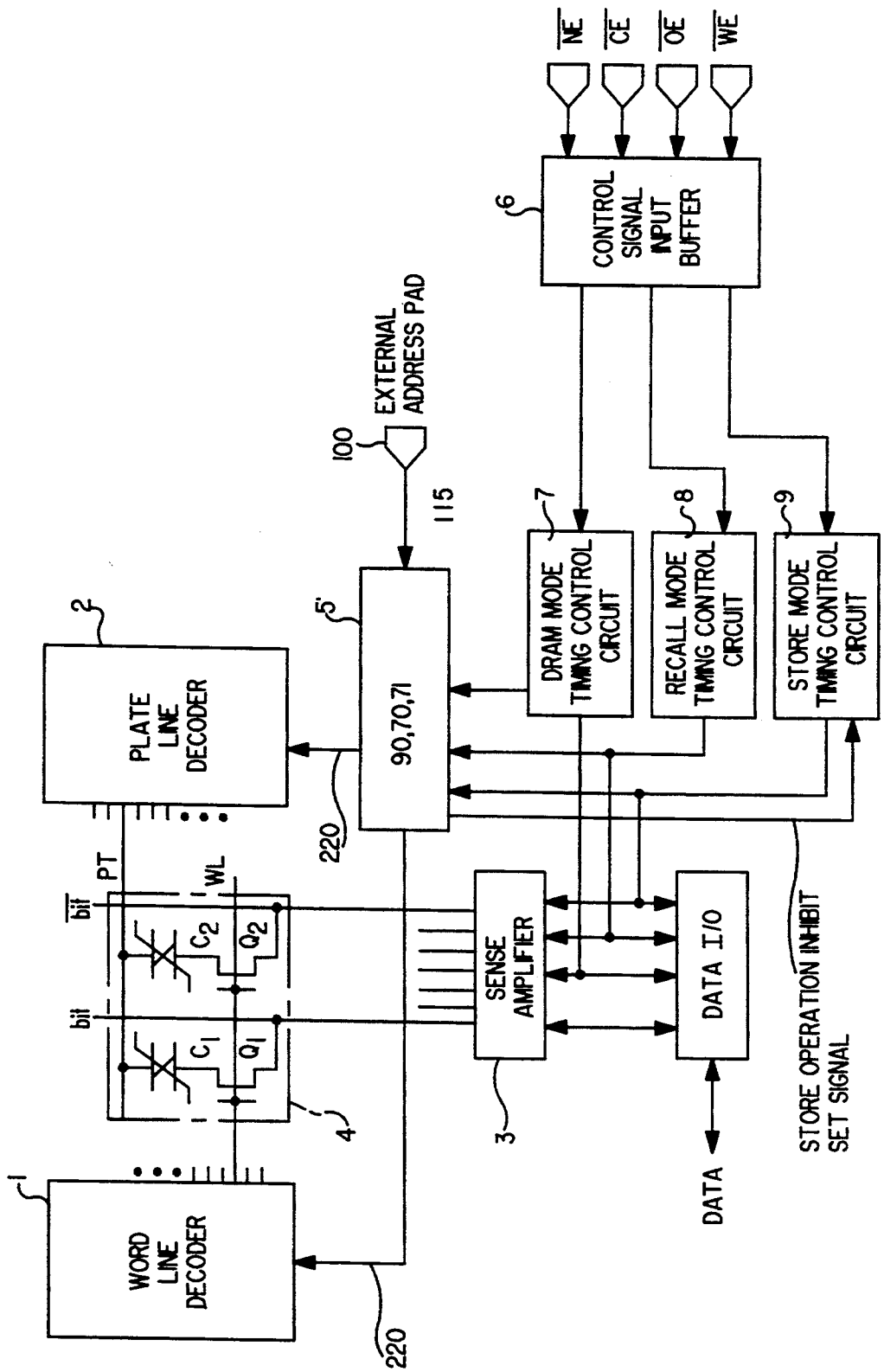
FIG. 13B is a block diagram showing another exemplary case where the page store device according to the present invention is provided in the NVDRAM memory device.

FIG. 13B is a block diagram showing another exemplary case where the page store device of the present example is provided in the NVDRAM memory device. In this case, the mode selector circuit 17 is not provided. The store operation inhibit set signal is directly given To the store mode timing control circuit 9, whereby the store operation is inhibited. For example, a switching circuit can be provided on the output side of the store mode timing control circuit 9.

The address decoding circuit 225 corresponds to the word line decoder 1 and the plate line decoder 2 in FIGS. 13A and 13B.

EXAMPLE 3

The page store device and the page store method using the same has been described above. The same structure and method can be applied to a page recall device and a page recall method using the same. The reason for this is that a recall operation is also performed for each page (i.e., word line) and involves the polarization inversion of a ferroelectric of the memory cell in the same way as in the store operation.

In the present example, a page recall start address signal is given to the counter circuit through the address selector circuit. A signal output from the counter circuit is input to the address selector circuit again and transmitted to the address decoding circuit to be used as an actual page recall start address.

The page recall start address can be addressed through the external address pad, for example. A user can choose to perform a recall operation for memory cells corresponding to only one page starting from the address or to perform a store operation for memory cells corresponding to several pages starting from the address. In each recall operation, data is recalled from in only one memory cell per bit line. Alternatively, the signal generated inside a page recall device can be used as the page recall start address. More specifically, an initial count value of the counter circuit can be arbitrarily set, so that the memory cell array is divided into some regions and the recall operation can be performed with respect to a certain region among them. Moreover, the certain region where the recall operation is performed can be changed and arbitrarily selected.

Compared with the case where the recall operation is performed for all of the memory cells in the NVDRAM memory device, it is more effective, in most cases, that the recall operation is performed for only the memory cells corresponding to the desired pages. For example, the memory cells in the NVDRAM memory device are divided into some sections. Each section functions independently, and can be used independently of the other sections. Thus, it is more effective that data of pages constituting a certain section is recalled, compared with the case where data of all of the pages constituting all of the sections is recalled. In addition, since the recall operation is performed for each section, the wasteful number of polarization inversions is decreased, compared with the case where each recall operation is performed for all of the memory cells.

Hereinafter, the operation of the page recall device will be described with reference to FIGS. 14 to 16. The components identical to those in the case of the page store device bear the reference numerals identical thereto.

Figure 15:
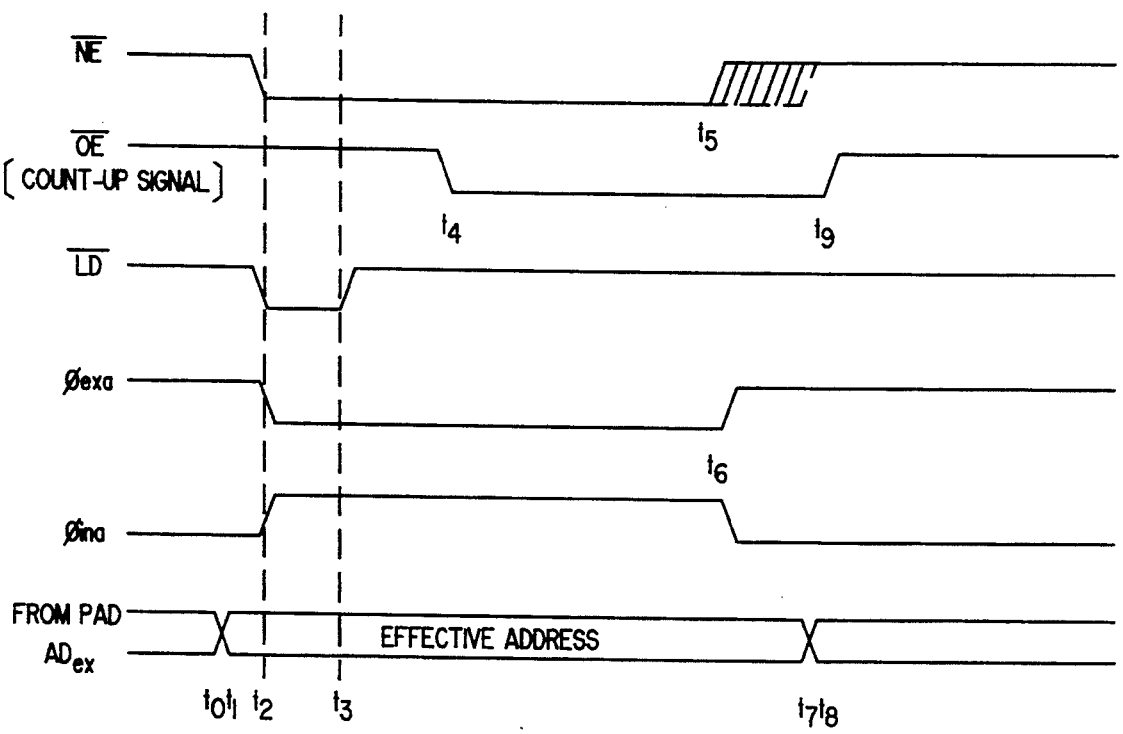
FIG. 15 is a timing chart of various signals used in a page recall method using the page recall device according to the present invention.

As shown in FIG. 15, from the time $t_0$ to the time $t_1$, a desired page recall start address is input to the external address pad 100. At the time $t_2$, a non-volatile enable signal $\overline{NE}$ goes to a low level. As a result, the load signal $\overline{LD}$ is generated, the external address enable signal $\Phi_{exa}$ goes to a low level, and the internal address enable signal $\Phi_{ina}$ goes to a high level. The non-volatile enable signal $\overline{NE}$ switches the level of the external address enable signal $\Phi_{exa}$ and that of the internal address enable signal $\Phi_{ina}$. The non-volatile enable signal $\overline{NE}$ is given to the address selector circuit 90.

The external address enable signal $\Phi_{exa}$ is active (high) during the normal read and write operation of the page recall device, but is not active (low) during the page recall operation. The internal address enable signal $\Phi_{ina}$ is active (high) during the page recall operation, but is not active (low) during the read and write operation of the page recall device. The address enable signal $\Phi_{aeb}$ is at a high level at all times during the page recall operation.

Since the address enable signal $\Phi_{aeb}$ is at a high level, the address signal $(AD_{exi})$ 115 from the external address pad 100 is inverted through the NAND gate 120 of the address selector circuit 90. At this time, the external address enable signal $\Phi_{exa}$ is at a low level, the transmission gate 160 is turned OFF and the address signal 115 is routed through the inverter 150 and ends up as the second start address signal $(AD_{pdi})$ 110. The second start address signal $(AD_{pdi})$ 110 is given to the counter circuit 170.

The second start address signal $(AD_{pdi})$ 110 becomes the counter input signal 50 to be given to the counter circuit 170. The load signal $\overline{LD}$ is a pulse signal at a low level at the time t₂, so that the counter input signal (AD$_{pdi}$) 50 is loaded on the address line 20. Each output signal A$_i$ transmitted via the address line 20 constitutes one page recall start address addressed by the external address pad 100, and becomes the input signal A$_i$ which is returned to the address selector circuit 90 via the terminal 230. The load signal LD returns to a high level at the time t₃.

The internal address enable signal Φ$_{ina}$ goes to a high level at the time t₂, so that the input signal A$_i$ is transmitted through the transmission gate 240 and the inverter 210. At this time, the input signal A$_i$ is converted to an address signal which can be used as the present start address for the recall operation.

At the time t₄, the read enable signal $\overline{OE}$ goes to a low level, and the page recall device of the present example commands the start of the recall operation using the page recall start address which has been previously loaded onto the external address pad 100. The page recall operation is performed between the times t₄ and t₉. During this operation, the volatile DRAM data is recalled from a degraded state to full logic 0 or 1 voltage level.

At a certain time after t₅, the non-volatile enable signal $\overline{NE}$ returns to a high level to be reset. At the time t₉, the read enable signal $\overline{OE}$ returns to a high level to be reset. When the non-volatile enable signal $\overline{NE}$ goes to a high level at a certain time (e.g., t₆) before t₉, the external address enable signal Φ$_{exa}$ goes to a high level and the internal address enable signal Φ$_{ina}$ returns to a low level.

Between the time t₇ and t₈ (after t₅), another address may be loaded onto the external address pad 100 in preparation for another recall operation. Alternatively at this time, since the read enable signal $\overline{OE}$ also lunchions as the count-up signal 30, the outputs of the load counters 10 increase by 1 whenever the read enable signal $\overline{OE}$ goes to a high level, for example, at t₉. Thus, instead of inputting an address signal for a new recall operation from the external address pad 100, one may choose to use the address whose output is increased on the counter circuit 170 to automatically recall the next consecutive page.

In this case, during the subsequent page recall operation, the internal address enable signal Φ$_{ina}$ which went to a high level at t₂ allows the input signal A$_i$ to be transmitted through the transmission gate 240. The input signal A$_i$ is output as the signal 220 via the inverter 210 to address the next consecutive pages with respect to the address decoding circuit 225. In the page recall operation, the address decoding circuit 225 is designed so that only the word line WL and the plate line PT corresponding thereto will be a logic 1 for a given recall operation.

Thus, in the page recall device of the present example, as shown in FIG. 11, when a word line WL$_n$ and a plate line PT$_n$, for instance, are activated, all of the bit lines B₁ through B$_m$ are activated and volatile data is detected by the sense amplifiers SA₁ through SA$_m$. The sense amplifiers SA₁ through SA$_m$ may be conventional ones. Thereafter, the plate line PT$_n$ is used to restore (rewrite) volatile data which was stored in the entire page, i.e., all of the memory cells along the word line WL$_n$.

None of the plate lines PT should be activated except for one plate line PT$_n$ corresponding to the word line WL$_n$ which is being activated. This is because a recall operation on other memory cells can destroy the data in those memory cells, there being no recall operation on those memory cells. In view of this, according to the present invention, a memory cell array is designed as follows:

The memory cell array includes a plurality of bit lines, a plurality of word lines, a plurality of plate lines, and a plurality of memory cells. One bit line, one word line, and one plate line are connected to each memory cell. A first subset of memory cells connected to one of the bit lines does not overlap another first subset of memory cells connected to another one of the bit lines, and a second subset of memory cells connected to one of the word lines does not overlap another second subset of another one of the word lines.

In the present example, the NAND gate 120 is used in the address selector circuit 90 and the address enable signal (Φ$_{aeb}$) 130 is designed to be given to the NAND gate 120. The present invention is not limited to this structure. A NOR gate may be used in the address selector circuit 90; however, in this case, it is required that the polarization (high or low) of the address enable signal (Φ$_{aeb}$) 130 be inverted.

Figure 14:
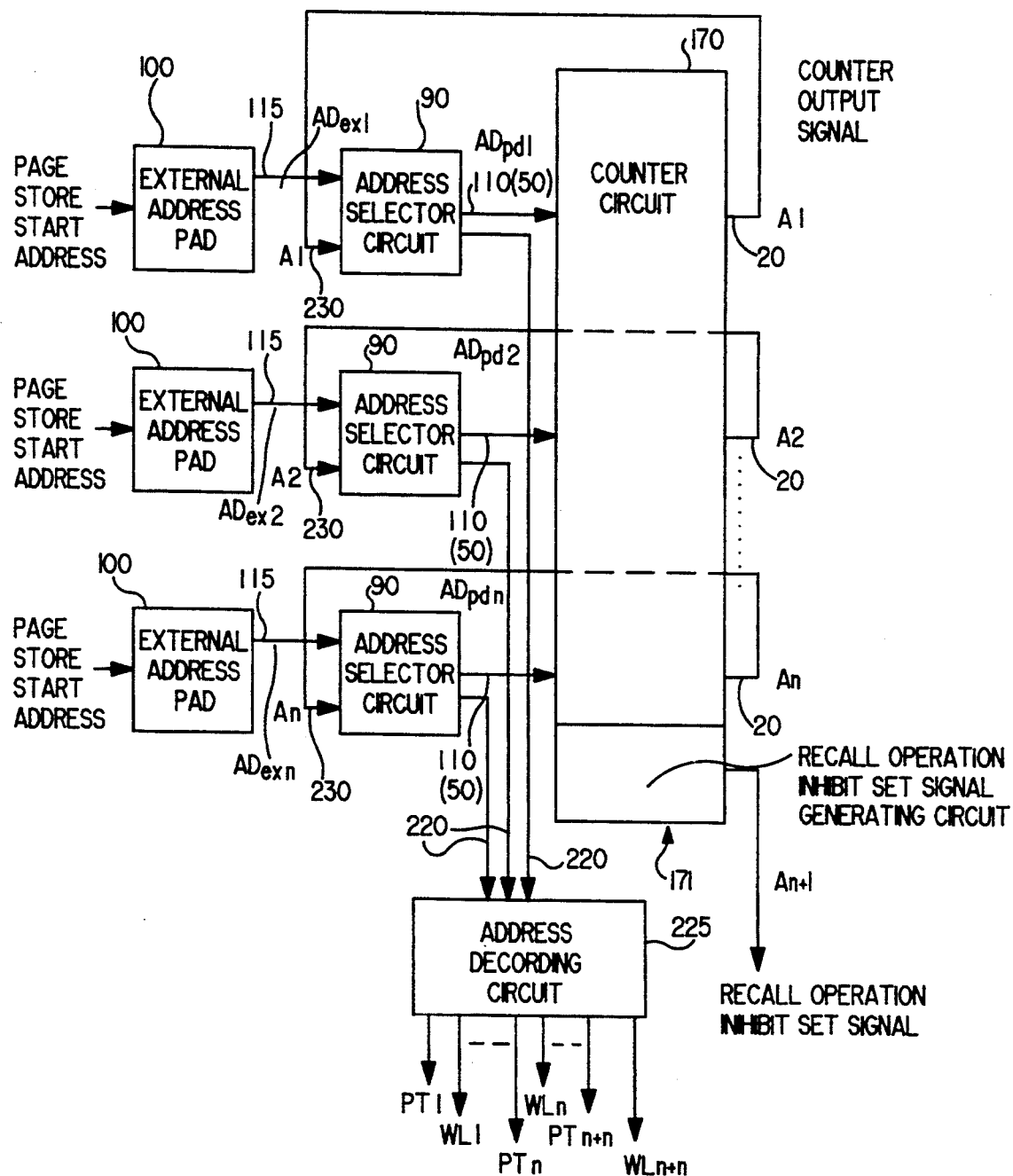
FIG. 14 is a block diagram showing a main portion of a page recall device according to the present invention.

In addition, according to the present invention, a circuit dedicated to a page recall operation can be used as the counter circuit 170 shown in FIG. 14. Alternatively, a refresh counter can be used together with the counter circuit 170. According to the present invention, the recall operation inhibit signal generating circuit 171 in FIG. 14 is designed to use a carry signal of the counter circuit 170 in FIG. 16. Other circuit can be used instead of the recall operation inhibit signal generating circuit 171.

Figure 16:
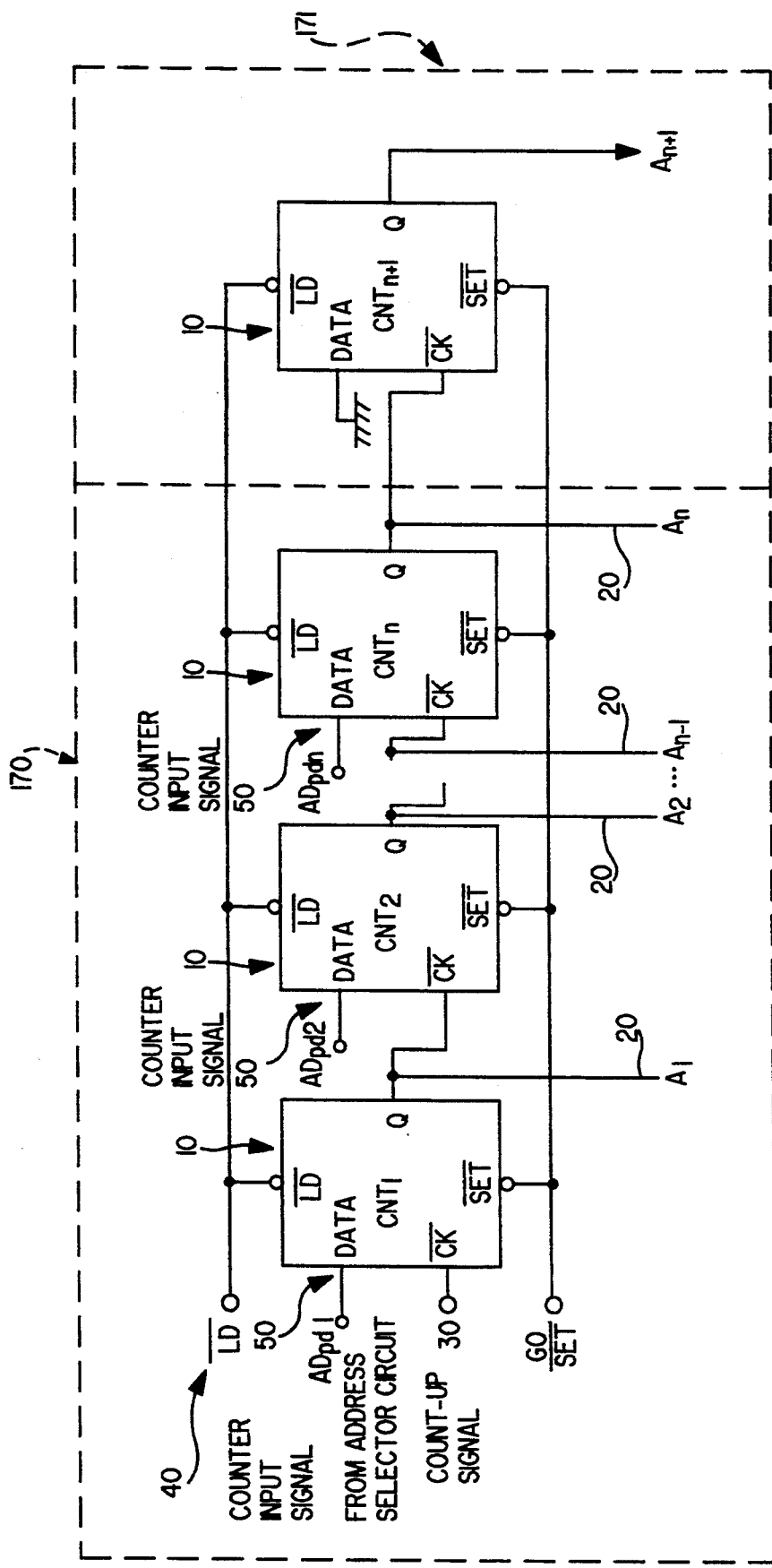
FIG. 16 is a circuit diagram showing a counter circuit and a recall operation inhibit signal generating circuit provided in the page recall device according to the present invention.

According to the present invention, as described regarding the counter circuit 170 shown in FIG. 16, the counter input signal 50 (the second start address signal 110) which is input to the counter circuit 170 can be input by a user of the page recall device. It can be designed that the counter input signal 50 is automatically generated in a computer or other circuits in the page recall device according to the present invention.

In the present example, it is supposed that the electric potential of the plate line PT is 0 V or V$_{cc}$ at all times. However the present invention is not limited thereto. During the DRAM operation performed after non-volatile data is transformed to volatile data (i.e., during the recall operation after the power source is turned ON), the electric potential of the plate line PT can be set at a value between 0 V and V$_{cc}$ such as V$_{cc}$/2. In this case, there is an advantage that the electric field applied to both terminals of the ferroelectric is alleviated.

During the recall operation, by varying the voltage, which is applied to the plate line PT corresponding to the word line WL of the selected memory cell, between 0 V and V$_{cc}$, the ferroelectric of the memory cell has its polarization inverted, whereby data is stored in a non-volatile manner. In the case where the electric potential of the plate line PT is V$_{cc}$/2, the thickness of the ferroelectric film is set so as not to cause the polarization inversion thereof.

Figure 17A:
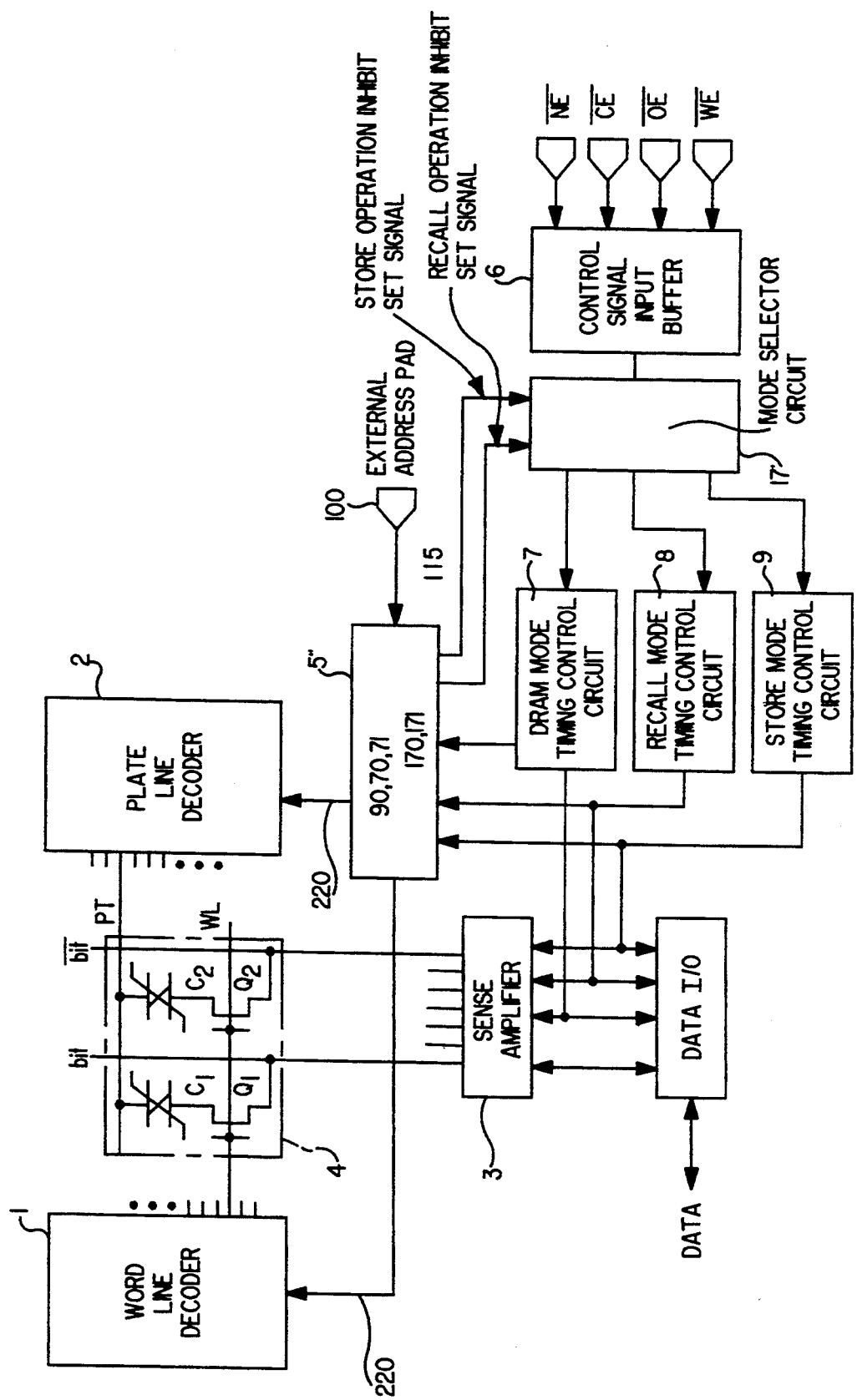
FIG. 17A is a block diagram showing an exemplary case where the page recall device according to the present invention is provided in the NVDRAM memory device.

FIG. 17A is a block diagram showing an exemplary case where the page recall device of the present example is provided in the NVDRAM memory device. This figure shows a case where the page recall device of the present invention is further provided in the NVDRAM of Example 2 shown in FIG. 13A. The components identical to those in the other examples bear the reference numerals identical thereto.

A block 5" of FIG. 17A represents the address selector circuit 90, the counter circuits 70 and 170, the store inhibit signal generating circuit 71, and the recall inhibit signal generating circuit 171. The mode selector circuit 17' selects a mode in accordance with a signal given thereto. Upon receiving a store operation inhibit set signal, the mode selector circuit 17' prevents a signal from being transmitted to the store mode timing control circuit 9. Thus, a store mode is not selected, and a store operation is inhibited. Upon receiving the recall operation inhibit set signal, the mode selector circuit 17' prevents a signal from being transmitted to the recall mode timing control circuit 8. Thus, a recall mode is not selected, and a recall operation is inhibited. For example, the mode selector circuit 17' can be formed of a switching circuit and an OR circuit in the same way as in Example 1.

Figure 17B:
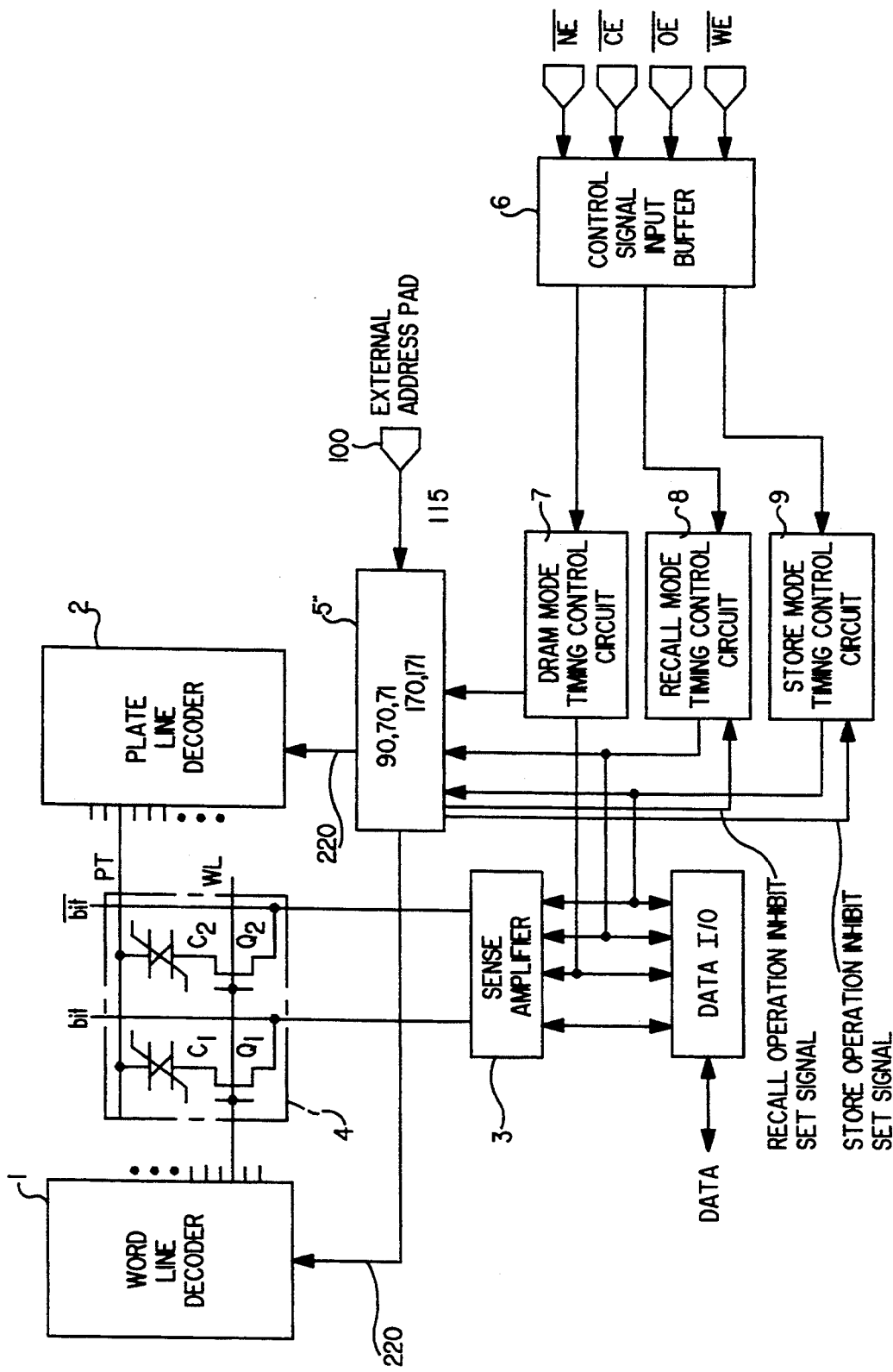
FIG. 17B is a block diagram showing another exemplary case where the page recall device according to the present invention is provided in the NVDRAM memory device.

FIG. 17B is a block diagram showing another exemplary case where the page recall device of the present example is provided in the NVDRAM memory device. In this case, the mode selector circuit 17' is not provided. The recall operation inhibit set signal is directly given to the recall mode timing control circuit 8, whereby the recall operation is inhibited. For example, a switching circuit can be provided on an output side of the recall mode timing control circuit 8.

The address decoding circuit 225 corresponds to the word line decoder 1 and the plate line decoder 2 in FIGS. 17A and 17B.

As is understood from the above description, according to the present invention, there are the following advantages:

Wasteful recall operations and store operations are inhibited. Thus, the polarization inversion of a ferroelectric is not repeated more than necessary so as to prevent the life time of a memory cell from being unexpectedly shortened.

Data read from a memory cell by the recall operation can be restored in the identical memory cell in a non-volatile manner. Thus, the stored data is safely guarded.

An electric charge stored in a capacitor is discharged before the recall operation. Thus, non-volatile data is read accurately.

A dummy cell in the NVDRAM memory device having a ferroelectric using one transistor per cell can be constructed in the same configuration as that of a normal memory cell, making it easy to produce the NVDRAM memory device.

The store operation right after a power source is turned ON is inhibited. Therefore, the stored data is safely guarded.

In the case of the page store/recall device according to the present invention, a page store/recall start address is transmitted to the counter circuit via the address selector circuit. The output from the counter circuit is transmitted to the address decoding circuit via the address selector circuit, where the page store/recall start address is converted so as to be used for a memory cell array as an actual page store/recall start address. Because of this, data can be stored in or recalled from the memory cells corresponding to one page at any time in the NVDRAM memory device. By automatically increasing a counter output by 1, data can be stored in or recalled from the memory cells corresponding to consecutive pages. When a page store/recall start address becomes a predetermined address, the store/recall operation is inhibited inside the NVDRAM memory device. Thus, the waste of time and the number of polarization inversion of a ferroelectric due to the bugs in a program or the runaway of a peripheral control circuit can be decreased.

When the page store/recall device according to the present invention is used in NVDRAM memory devices which cannot perform the store/recall of data in a block mode, the page store/recall is made possible in such a device. Moreover, according to the present invention, a user can choose to perform a store (or recall) operation for memory cells corresponding to only one page starting from a certain address or to perform a store (or recall) operation for memory cells corresponding to several pages starting from the address by addressing a predetermined page store/recall start address to enable the store/recall of data in memory cells corresponding to consecutive pages. Thus, if the first page is addressed, the input of the external address is not required for the subsequent store/recall of data, making it easy to use the NVDRAM memory device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An NVDRAM memory device which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, comprising:
   counting means for counting the number of the recall or store operations, which generates an inhibit signal in the case where a counted value exceeds a predetermined value and resets the counted value in response to an external reset signal; and
   inhibit means for inhibiting the recall or store operation in response to the inhibit signal given from the counting means.

2. An NVDRAM memory device according to claim 1, wherein the memory cell has a capacitor with a ferroelectric, the non-volatile data is held due to a polarization of the ferroelectric, and the volatile data is held due to an electric charge stored in the capacitor.

3. An NVDRAM memory device according to claim 2, wherein the recall operation is performed by detecting a change of an electric potential caused at a storage node of the capacitor in accordance with a state of the polarization, in the case where a voltage signal is applied to a plate electrode of the capacitor.

4. An NVDRAM memory device according to claim 2, wherein the store operation is performed by applying a voltage signal, which corresponds to data, to the storage node of the capacitor and applying a pulse voltage signal to the plate electrode of the capacitor, thereby putting the ferroelectric in a polarized state corresponding to the data.

5. An NVDRAM memory device according to claim 1, wherein the memory cell has a DRAM cell portion and an EEPROM cell portion, the non-volatile data is held in the EEPROM cell portion of the memory cell, and the volatile data is held in the DRAM cell portion of the memory cell.

6. An NVDRAM memory device according to claim 1, comprising: restoring means for restoring the non-volatile data recalled from the memory cell in the identical memory cell during the recall operation; and canceling means for canceling the inhibit of the store operation when the recall operation starts or ends.

7. An NVDRAM memory device according to claim 1, comprising initial store inhibit means for inhibiting the store operation when a power source is turned ON in the NVDRAM memory device.

8. An NVDRAM memory device according to claim 1, wherein the counting means has a recall operation counter and a store operation counter, and the initial store inhibit means has first switching means and second switching means.

9. An NVDRAM memory device according to claim 8, comprising:
   recall mode control means for controlling the recall operation;
   store mode control means for controlling the store operation;
   DRAM mode control means for controlling the read/write/refresh operation; and
   signal input means for generating a recall mode selection signal, a store mode selection signal, and a DRAM mode selection signal, giving the recall mode selection signal to the recall operation counter, the store operation counter, and the first switching means, giving the store mode selection signal to the store operation counter and the second switching means, and giving the DRAM mode selection signal to the recall operation counter and the DRAM mode control means, wherein
   the recall operation counter counts the input number of the recall mode selection signals to generate a recall inhibit signal in the case where a counted value exceeds a predetermined value and to reset the counted value upon receiving the DRAM mode selection signal;
   the store operation counter counts the input number of the store mode selection signals to generate a store inhibit signal in the case where a counted value exceeds a predetermined value and resets the counted value upon receiving the recall mode selection signal;
   the first switching means switches an output of the recall mode selection signal from a first output to a second output in response to the recall inhibit signal, the first output being connected to the recall mode control means, and the second output being connected to the DRAM mode control means; and
   the second switching means blocks the store mode selection signal in response to the store inhibit signal.

10. A page recall method in an NVDRAM memory device which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, the method comprising the steps of:
   counting the number of the recall operations;
   generating a recall operation inhibit signal in the case where a counted value of the recall operations exceeds a predetermined value;
   inhibiting the recall operation in response to the recall operation inhibit signal; and
   resetting the counted value of the recall operations in response to a reset signal.

11. A page store method in an NVDRAM memory device which performs a recall operation in which non-volatile data stored in a memory cell is converted to volatile data in a recall mode, a store operation in which the volatile data stored in the memory cell is converted to the non-volatile data in a store mode, and a read/write operation in which the volatile data stored in the memory cell is read or written in a DRAM mode, the method comprising the steps of:
   counting the number of the store operations;
   generating a store operation inhibit signal in the case where a counted value of the store operations exceeds a predetermined value;
   inhibiting the store operation in response to the store operation inhibit signal; and
   resetting the counted value of the store operations in response to a reset signal.

12. A page store method according to claim 11, comprising the steps of: restoring the non-volatile data, which is recalled from the memory cell during the recall operation, in the identical memory cell; and canceling the inhibit of the store operation when the recall operation starts or ends.

13. A page store method according to claim 11, further comprising an initial store inhibit step of inhibiting the store operation right after a power source is turned ON in the NVDRAM memory device.

14. A page store device provided in an NVDRAM memory device having address lines, comprising:
   a plurality of address selector circuits, each having a first input to which a page store start address signal for addressing an externally designated address or an internally Generated address is input, a first output via which a second start address signal corresponding to the page store start address signal is output, a second input, and a second output;
   a counter circuit having a plurality of counter inputs respectively connected to the first outputs of the plurality of address selector circuits and a plurality of counter outputs respectively connected to the second inputs of the plurality of address selector circuits through the respective address lines, the counter circuit generating a counter output signal corresponding to the second start address signal input to the counter inputs and outputting the counter output signal from the counter outputs to the second inputs of the address selector circuit through the address line; and
   an address decoding circuit which is connected to the second output of each of the address selector circuits and which receives an output signal from the second output to address a page to be stored.

15. A page store device according to claim 14, wherein each of the address selector circuits comprises:
   an output gate outputting the second start address signal via the first output based on a first enable signal and the page store start address signal;
   a first Transmission gate outputting the second start address signal via the second output based on the second enable signal; and
   a second transmission gate outputting the counter output signal, which is given to the second input, via the second output based on a third enable signal.

16. A page store device according to claim 14, wherein the counter circuit comprises means for increasing a value of the counter output signal.

17. A page store device according to claim 16, wherein the address decoding circuit addresses consecutive pages to be stored based on an increased value of the counter output signal.

18. A page store device according to claim 14, comprising: a store operation inhibit signal Generating circuit generating a store operation inhibit signal based on a count signal given from the counter circuit; and store operation inhibit means for inhibiting a page store operation based on the store operation inhibit signal.

19. A page store method in an NVDRAM memory device provided with a memory cell array, in which the memory cell array has a plurality of bit lines, a plurality of word lines, a plurality of plate lines, and a plurality of memory cells; each of the memory cells is connected to one bit line, one word line, and one plate line; each of the bit lines is connected to one of a plurality of first subsets of the memory cell and the first subset does not overlap with another first subset to which another bit line is connected; each of the word lines and each of the plate lines corresponding thereto are connected to one of a plurality of second subsets of the memory cells; and the second subset does not overlap with another second subset to which another word line and another plate line corresponding thereto are connected, the method comprising;
a first step of activating one of the word lines and addressing each memory cell of the second subset to which the activated word line is connected, thereby activating the second subset;
a second step of activating all of the bit lines and accessing each memory cell, among any of the first subsets of the memory cells, which also belongs to the second subset activated in the first step; and
a third step of activating the plate line corresponding to the word line activated in the first step, thereby storing the data of each memory cell accessed in the second step.

20. A page store method according to claim 19, wherein the first step, the second step, and the third step are inhibited in the case where a predetermined condition is provided.

21. A page store method according to claim 19, comprising the steps of;
counting the number of the addressings in the first step;
generating a store inhibit signal in the case where a counted value exceeds a predetermined value; and
inhibiting the first step, the second step, and the third step based on the store inhibit signal.

22. A page recall device provided in an NVDRAM memory device having address lines, comprising:
a plurality of address selector circuits, each having a first input to which a page recall start address signal for addressing an externally designated address or an internally generated address is input, a first output via which a second start address signal corresponding to the page recall start address signal is output, a second input, and a second output;
a counter circuit having a plurality of counter inputs respectively connected to the first outputs of the plurality of address selector circuits and a plurality of counter outputs respectively connected to the second inputs of the plurality of address selector circuits through the respective address lines the counter circuit generating a counter output signal corresponding to the second start address signal input to the counter inputs and outputting the counter output signal from the counter outputs to the second inputs of the address selector circuit through the address line;
an address decoding circuit which is connected to the second output of each of the address selector circuits and which receives an output signal from the second output to address a page to be recalled;
means for arbitrarily setting an initial count value of the counter circuit;
a recall operation inhibit signal generating circuit generating a recall operation inhibit signal based on a count signal given from the counter circuit; and
recall operation inhibit means for inhibiting a page recall operation based on the recall operation inhibit signal.

23. A page recall device according to claim 22, wherein each of the address; selector circuits comprises:
an output gate outputting the second start address signal via the first output based on a first enable signal and the page recall start address signal;
a first transmission gate outputting the second start address signal via the second output based on the second enable signal; and
a second transmission gate outputting the counter output signal, which is given to the second input, via the second output based on a third enable signal.

24. A page recall device according to claim 22, wherein the counter circuit comprises means for increasing a value of the counter output signal.

25. A page recall device according to claim 24, wherein the address decoding circuit addresses consecutive pages to be recalled based on an increased value of the counter output signal.

26. A page recall method in an NVDRAM memory device provided with a memory cell array, in which the memory cell array has a plurality of bit lines, a plurality of word lines, a plurality of plate lines, and a plurality of memory cells; each of the memory cells is connected to one bit line, one word line, and one plate line; each of the bit lines is connected to one of a plurality of first subsets of the memory cell and the first subset does not overlap with another first subset to which another bit line is connected; each of the word lines and each of the plate lines corresponding thereto are connected to one of a plurality of second subsets of the memory cells; and the second subset does not overlap with another second subset to which another word line and another plate line corresponding thereto are connected, the method comprising;
a first step of activating one of the word lines and addressing each memory cell of the second subset to which the activated word line is connected, thereby activating the second subset;
a second step of activating all of the bit lines and accessing each memory cell, among any of the first subsets of the memory cells, which also belongs to the second subset activated in the first step; and
a third step of activating the plate line corresponding to the word line activated in the first step, thereby recalling the data of each memory cell accessed in the second step; and
a fourth step of inhibiting the first step, the second step, and the third step in the case where a predetermined condition is provided.

27. A page recall method according to claim 26, comprising the steps of counting the number of the addressings in the first step; and generating a recall inhibit signal in the case where a counted value exceeds a predetermined value, wherein the fourth step is executed based on the recall inhibit signal.

* * * * *

UNITED STATES PATENT AND TRADEMARK OFFICE

CERTIFICATE OF CORRECTION

PATENT NO. : 5,381,379

DATED : January 10, 1995

INVENTOR(S) : KATSUMI FUKUMOTO

It is certified that error appears in the above-identified patent and that said Letters Patent is hereby corrected as shown below:

```
Column 35, line 68
Claim 22, line 15: Is "address lines the"
                      should read --address lines, the--.
```

In the Drawings:

1) FIG. 1, upper left hand corner, inside block 11: The reference line of reference $C_D$ points toward the middle between elements $C_D$ and $Q_D$. The reference line of reference $C_D$ should point toward element $C_D$.

2) FIGURES 3A and 3B, blocks referenced 4 and 11: the lines defining blocks 4 and 11 are solid lines. The lines defining blocks 4 and 11 should be dashed lines as shown.

3) FIG. 5, diagram of signal bit: The dashed line referenced "1" and its continuing solid line are not at the same level as the solid line at the beginning of the diagram on the left side. The dashed line referenced "1" and its continuing solid line should be at the same level as the solid line at the beginning of the diagram on the left side.

UNITED STATES PATENT AND TRADEMARK OFFICE

CERTIFICATE OF CORRECTION

PATENT NO. : 5,381,379

DATED : January 10, 1995

INVENTOR(S) : KATSUMI FUKUMOTO

It is certified that error appears in the above-identified patent and that said Letters Patent is hereby corrected as shown below:

4)  FIG. 6, diagram of signal ~~bit~~ : The dashed line referenced "1" and its continuing solid line are not at the same level as the solid line at the beginning of the diagram on the left side. The dashed line referenced "1" and its continuing solid line should be at the same level as the solid line at the beginning of the diagram on the left side.

5)  FIG. 8, upper left side: The reference line of reference $AD_{ex1}$ crosses the signal line referenced 115. The reference line of reference $AD_{ex1}$ should not cross the signal line referenced 115 but end at it.

6)  FIG. 10: Input signal line of inverter 150 crosses signal line between AND gate 120 and dashed block 190. Input signal line of inverter 150 should not cross signal line between AND gate 120 and dashed block 190, but should end at the signal line between AND gate 120 and dashed block 190, and connection should be shown by a connection dot.

UNITED STATES PATENT AND TRADEMARK OFFICE
CERTIFICATE OF CORRECTION

PATENT NO. : 5,381,379

DATED : January 10, 1995

INVENTOR(S) : KATSUMI FUKUMOTO

It is certified that error appears in the above-indentified patent and that said Letters Patent is hereby corrected as shown below:

7)     FIG. 14, upper left side: The reference line of reference $AD_{ex1}$ crosses the signal line referenced 115. The reference line of reference $AD_{ex1}$ should not cross the signal line referenced 115 but end at it.

Signed and Sealed this

Twenty-third Day of May, 1995

Attest:

BRUCE LEHMAN

Attesting Officer      *Commissioner of Patents and Trademarks*

UNITED STATES PATENT AND TRADEMARK OFFICE
CERTIFICATE OF CORRECTION

PATENT NO. : 5,381,379

DATED : January 10, 1995

INVENTOR(S) : KATSUMI FUKUMOTO

It is certified that error appears in the above-identified patent and that said Letters Patent is hereby corrected as shown below:

Column 35, line 68
Claim 22, line 15: Is "address lines the"
                   should read --address lines, the--.

<u>In the Drawings</u>:

1) FIG. 1, upper left hand corner, inside block 11: The reference line of reference $C_D$ points toward the middle between elements $C_D$ and $Q_D$. The reference line of reference $C_D$ should point toward element $C_D$.

2) FIGURES 3A and 3B, blocks referenced 4 and 11: the lines defining blocks 4 and 11 are solid lines. The lines defining blocks 4 and 11 should be dashed lines as shown.

3) FIG. 5, diagram of signal bit: The dashed line referenced "1" and its continuing solid line are not at the same level as the solid line at the beginning of the diagram on the left side. The dashed line referenced "1" and its continuing solid line should be at the same level as the solid line at the beginning of the diagram on the left side.

UNITED STATES PATENT AND TRADEMARK OFFICE
CERTIFICATE OF CORRECTION

PATENT NO. : 5,381,379

DATED : January 10, 1995

INVENTOR(S) : KATSUMI FUKUMOTO

It is certified that error appears in the above-identified patent and that said Letters Patent is hereby corrected as shown below:

4) FIG 6, diagram of signal bit: The dashed line referenced "1" and its continuing solid line are not at the same level as the solid line at the beginning of the diagram on the left side. The dashed line referenced "1" and its continuing solid line should be at the same level as the solid line at the beginning of the diagram on the left side.

5) FIG. 8, upper left side: The reference line of reference $AD_{ex1}$ crosses the signal line referenced 115. The reference line of reference $AD_{ex1}$ should not cross the signal line referenced 115 but end at it.

6) FIG. 10: Input signal line of inverter 150 crosses signal line between AND gate 120 and dashed block 190. Input signal line of inverter 150 should not cross signal line between AND gate 120 and dashed block 190, but should end at the signal line between AND gate 120 and dashed block 190, and connection should be shown by a connection dot.

UNITED STATES PATENT AND TRADEMARK OFFICE
CERTIFICATE OF CORRECTION

PATENT NO. : 5,381,379
DATED : January 10, 1995
INVENTOR(S) : Katsumi Fukumoto

It is certified that error appears in the above-indentified patent and that said Letters Patent is hereby corrected as shown below:

7) FIG. 14, upper left side: The reference line of reference $AD_{ex1}$ crosses the signal line referenced 115. The reference line of reference $AD_{ex1}$ should not cross the signal line referenced 115 but end at it.

This certificate supersedes Certificate of Correction issued May 23, 1995.

Signed and Sealed this

Twelfth Day of September, 1995

Attest:

BRUCE LEHMAN

*Attesting Officer*  Commissioner of Patents and Trademarks